(12) United States Patent
Sasaki et al.

(10) Patent No.: US 7,745,259 B2
(45) Date of Patent: Jun. 29, 2010

(54) LAYERED CHIP PACKAGE AND METHOD OF MANUFACTURING SAME

(75) Inventors: Yoshitaka Sasaki, Milpitas, CA (US); Hiroyuki Ito, Milpitas, CA (US); Tatsuya Harada, Tokyo (JP); Nobuyuki Okuzawa, Tokyo (JP); Satoru Sueki, Tokyo (JP)

(73) Assignees: Headway Technologies, Inc., Milpitas, CA (US); TDK Corporation, Tokyo (JP)

( * ) Notice: Subject to any disclaimer, the term of this patent is extended or adjusted under 35 U.S.C. 154(b) by 0 days.

(21) Appl. No.: 12/216,168

(22) Filed: Jun. 30, 2008

(65) Prior Publication Data

US 2009/0321957 A1 Dec. 31, 2009

(51) Int. Cl.
*H01L 21/44* (2006.01)
(52) U.S. Cl. .................. 438/109; 438/612; 438/617; 257/781; 257/786; 257/E23.194
(58) Field of Classification Search ................ 257/777, 257/778, 781, 784, 786, E23.001, 780, 750, 257/758, 686, 678, E23.194; 438/108, 612, 438/611, 617, 618, 622
See application file for complete search history.

(56) References Cited

U.S. PATENT DOCUMENTS 5,953,588 A 9/1999 Camien et al.

7,127,807 B2 10/2006 Yamaguchi et al.
2008/0230922 A1* 9/2008 Mochizuki et al. .......... 257/777

OTHER PUBLICATIONS

Gann, "Neo-Stacking Technology", HDI Magazine, Dec. 1999.
U.S. Appl. No. 11/878,282, filed Jul. 23, 2007, in the name of Yoshitaka Sasaki et al.
U.S. Appl. No. 11/896,709, filed Sep. 5, 2007, in the name of Yoshitaka Sasaki et al.
U.S. Appl. No. 12/213,645, filed Jun. 23, 2008, in the name of Yoshitaka Sasaki et al.
U.S. Appl. No. 12/216,144, filed Jun. 30, 2008, in the name of Yoshitaka Sasaki et al.
U.S. Appl. No. 12/216,143, filed Jun. 30, 2008, in the name of Yoshitaka Sasaki et al.

* cited by examiner

*Primary Examiner*—Hoa B Trinh
(74) *Attorney, Agent, or Firm*—Oliff & Berridge, PLC

(57) ABSTRACT

A layered chip package includes: a main body including a plurality of layer portions; wiring disposed on a side surface of the main body; a plurality of first terminals disposed on a top surface of the main body; and a plurality of second terminals disposed on a bottom surface of the main body. Each layer portion includes a semiconductor chip, an insulating portion covering at least one side surface of the semiconductor chip, and a plurality of electrodes connected to the semiconductor chip. Each electrode has an end face surrounded by the insulating portion and located at the side surface of the main body on which the wiring is disposed. The wiring is connected to the end faces of the plurality of electrodes of the plurality of layer portions, and to the plurality of first and second terminals.

6 Claims, 31 Drawing Sheets

LAYERED CHIP PACKAGE AND METHOD OF MANUFACTURING SAME

BACKGROUND OF THE INVENTION

1. Field of the Invention

The present invention relates to a layered chip package including a plurality of chips stacked, and to a method of manufacturing the same.

2. Description of the Related Art

In recent years, a reduction in weight and an improvement in performance have been demanded of mobile devices typified by cellular phones and notebook personal computers. Accordingly, there has been a demand for higher integration of electronic components for use in mobile devices. Higher integration of electronic components has been demanded also for achieving an increase in capacity of semiconductor memory.

As an example of highly integrated electronic components, a system-in-package (hereinafter referred to as SiP), especially an SiP utilizing a three-dimensional packaging technology for stacking a plurality of chips, has attracting attention in recent years. In the present application, a package including a plurality of chips stacked is called a layered chip package. Since the layered chip package allows a reduction in wiring length, it provides the advantage of allowing a higher operation speed for a circuit and a reduction in stray capacitance of wiring, as well as the advantage of allowing higher integration.

Major examples of three-dimensional packaging technology for fabricating a layered chip package include a wire bonding method and a through electrode method. According to the wire bonding method, a plurality of chips are stacked on a substrate and wire bonding is performed to connect a plurality of electrodes formed on each chip to external connecting terminals formed on the substrate. According to the through electrode method, a plurality of through electrodes are formed in each of chips to be stacked and inter-chip wiring is performed through the use of the through electrodes.

The wire bonding method has a problem that it is difficult to reduce the distance between the electrodes so as to avoid contact between wires, and a problem that high resistances of the wires hamper a high-speed operation of a circuit.

The through electrode method is free from the above-mentioned problems of the wire bonding method. Unfortunately, however, the through electrode method requires a large number of steps for forming the through electrodes in chips, and consequently increases the cost for the layered chip package. According to the through electrode method, forming the through electrodes in chips requires a series of steps as follows: forming a plurality of holes for the plurality of through electrodes in a wafer that will be cut later to become a plurality of chips; forming an insulating layer and a seed layer in the plurality of holes and on the top surface of the wafer; forming a plurality of through electrodes by filling the plurality of holes with metal such as Cu by plating; and removing unwanted portions of the seed layer.

According to the through electrode method, the through electrodes are formed by filling metal into holes having relatively high aspect ratios. Consequently, voids or keyholes are prone to occur in the through electrodes due to poor filling of the holes with metal, so that the reliability of wiring formed by the through electrodes tends to be reduced.

According to the through electrode method, an upper chip and a lower chip are physically joined to each other by connecting the through electrodes of the upper and lower chips by means of, for example, soldering. The through electrode method therefore requires that the upper and lower chips be accurately aligned and then joined to each other at high temperatures. When the upper and lower chips are joined to each other at high temperatures, however, misalignment between the upper and lower chips can occur due to expansion and contraction of the chips, which often results in electrical connection failure between the upper and lower chips.

The through electrode method has a further problem that, if the plurality of chips stacked include one or more defective chips, it is difficult to replace the defective chip(s) with non-defective one(s). In a layered chip package fabricated by the through electrode method, the respective through electrodes of the upper and lower chips are connected to each other by means of, for example, soldering. To remove a defective chip from the layered chip package, it is therefore necessary to melt solder between the defective chip and another chip by heating. This heating also melts solder between non-defective chips, and can thereby cause oxidation or flowing-out of the solder between the non-defective chips. As a result, electrical connection failure can occur between the non-defective chips. For this reason, according to the through electrode method, it is difficult to replace one or more defective chips, if included in the stack of a plurality of chips, with non-defective one(s). This can result in a reduction in yield and an increase in cost for the layered chip package.

U.S. Pat. No. 5,953,588 discloses a method of manufacturing a layered chip package as described below. In this method, a plurality of chips cut out from a processed wafer are embedded into an embedding resin and then a plurality of leads to be connected to each chip are formed, whereby a structure called a neo-wafer is fabricated. Next, the neo-wafer is diced to form a plurality of structures each called a neo-chip. Each neo-chip includes: one or more chips; resin surrounding the chip(s); and a plurality of leads. The plurality of leads connected to each chip each have an end face exposed at a side surface of the neo-chip. Next, a plurality of kinds of neo-chips are laminated into a stack. In the stack, the respective end faces of the plurality of leads connected to the chips of each layer are exposed at the same side surface of the stack.

Keith D. Gann, "Neo-Stacking Technology", HDI Magazine, December 1999, discloses fabricating a stack by the same method as U.S. Pat. No. 5,953,588, and forming wiring on two side surfaces of the stack.

The manufacturing method disclosed in U.S. Pat. No. 5,953,588 involves a number of process steps and this raises the cost for the layered chip package. According to this method, after the plurality of chips cut out from the processed wafer are embedded into the embedding resin, the plurality of leads to be connected to each chip are formed to fabricate the neo-wafer, as described above. Accurate alignment of the plurality of chips is therefore required when fabricating the neo-wafer. This is also a factor that raises the cost for the layered chip package.

U.S. Pat. No. 7,127,807 B2 discloses a multilayer module formed by stacking a plurality of active layers each including a flexible polymer substrate with at least one electronic element and a plurality of electrically-conductive traces formed within the substrate. According to this multilayer module, however, it is impossible to increase the proportion of the area occupied by the electronic element in each active layer, and consequently it is difficult to achieve higher integration.

An electronic component package, such as a layered chip package, is typically mounted on a wiring board for use. In the case of mounting a plurality of electronic component packages on a wiring board and electrically connecting the packages to each other, the electrical connection between the packages is established through the wiring board. In this case, the plurality of electronic component packages and wiring for electrically connecting them to each other occupy a large area of the wiring board, and this makes it difficult to achieve miniaturization of a system including the plurality of electronic component packages and the wiring board.

OBJECT AND SUMMARY OF THE INVENTION

It is an object of the present invention to provide a layered chip package, a method of manufacturing the same, and an electronic component including a plurality of layered chip packages to allow mass-production of a layered chip package including a stack of a plurality of chips at low cost in a short period of time, and to increase the variety of electrical connection between a plurality of layered chip packages.

A layered chip package of the present invention includes: a main body having a top surface, a bottom surface and four side surfaces; wiring disposed on at least one of the side surfaces of the main body; a plurality of first terminals disposed on the top surface of the main body; and a plurality of second terminals disposed on the bottom surface of the main body. The main body includes a plurality of layer portions stacked. Each of the plurality of layer portions includes: a semiconductor chip having a top surface, a bottom surface and four side surfaces; an insulating portion covering at least one of the four side surfaces of the semiconductor chip; and a plurality of electrodes connected to the semiconductor chip. The insulating portion has at least one end face located at the at least one of the side surfaces of the main body on which the wiring is disposed. Each of the plurality of electrodes has an end face that is surrounded by the insulating portion and located at the at least one of the side surfaces of the main body on which the wiring is disposed. The wiring is connected to the end faces of the plurality of electrodes of the plurality of layer portions, and to the plurality of first and second terminals.

A manufacturing method for the layered chip package of the present invention includes the steps of: fabricating a plurality of substructures that respectively correspond to the plurality of layer portions of the layered chip package, each substructure including a plurality of its corresponding layer portions and being intended to be cut later at a boundary between every adjacent ones of the plurality of its corresponding layer portions; and completing the layered chip package by fabricating the main body using the plurality of substructures and by forming the first terminals, the second terminals and the wiring on the main body.

In the manufacturing method for the layered chip package of the present invention, the step of fabricating the plurality of substructures includes, as a series of steps for fabricating each substructure, the step of fabricating a pre-substructure wafer by performing processing on a first surface of a semiconductor wafer having the first surface and a second surface that face toward opposite directions, the pre-substructure wafer having a first surface and a second surface that respectively correspond to the first surface and the second surface of the semiconductor wafer and including a plurality of pre-semiconductor-chip portions aligned, each of the pre-semiconductor-chip portions including a device;

the step of forming at least one groove in the pre-substructure wafer, the at least one groove opening at the first surface of the pre-substructure wafer and extending to be adjacent to at least one of the pre-semiconductor-chip portions;

the step of forming an insulating layer to fill the at least one groove, the insulating layer being intended to become part of the insulating portion later; and the step of forming the plurality of electrodes such that part of each of the electrodes lies on the insulating layer, wherein in the step of completing the layered chip package, the insulating layer may be cut to form a cut surface along a direction in which the at least one groove extends, whereby part of the at least one end face of the insulating portion may be formed by the cut surface of the insulating layer and the end faces of the plurality of electrodes may be exposed.

In the manufacturing method for the layered chip package of the present invention, the step of completing the layered chip package may include the steps of:

fabricating a layered substructure by stacking the plurality of substructures into a stack and providing a plurality of groups of first terminals and a plurality of groups of second terminals on the stack, wherein the plurality of substructures are stacked in correspondence with the order of stacking of the plurality of layer portions of the layered chip package;

forming a main body aggregate by cutting the layered substructure, the main body aggregate including a plurality of pre-main-body portions aligned in one direction that is orthogonal to the stacking direction of the plurality of layer portions, each of the pre-main-body portions being intended to later become the main body with the first terminals and the second terminals arranged thereon;

forming the wiring for each of the pre-main-body portions of the main body aggregate; and cutting the main body aggregate after the formation of the wiring so as to separate the plurality of pre-main-body portions from each other so that each of them becomes the main body and a plurality of layered chip packages are thereby formed.

In the step of fabricating the layered substructure, a first terminal wafer including the plurality of groups of first terminals and a second terminal wafer including the plurality of groups of second terminals may be respectively bonded to both end faces of the stack formed by stacking the plurality of substructures, the end faces being opposed to each other in a direction in which the substructures are stacked.

An electronic component of the present invention includes a plurality of layered chip packages of the present invention and is formed by electrically connecting every vertically adjacent two of the layered chip packages to each other. In the vertically adjacent two of the layered chip packages of this electronic component, the first terminals of the lower one of the layered chip packages are electrically connected to the second terminals of the upper one of the layered chip packages.

The layered chip package, its manufacturing method and the electronic component of the present invention make it possible to mass-produce the layered chip package at low cost in a short period of time, and to increase the variety of electrical connection between a plurality of layered chip packages.

The electronic component of the present invention allows easy reworking (remaking) of the electronic component including a plurality of layer portions.

Other and further objects, features and advantages of the invention will appear more fully from the following description.

DETAILED DESCRIPTION OF THE PREFERRED EMBODIMENTS

First Embodiment

Figure 1:
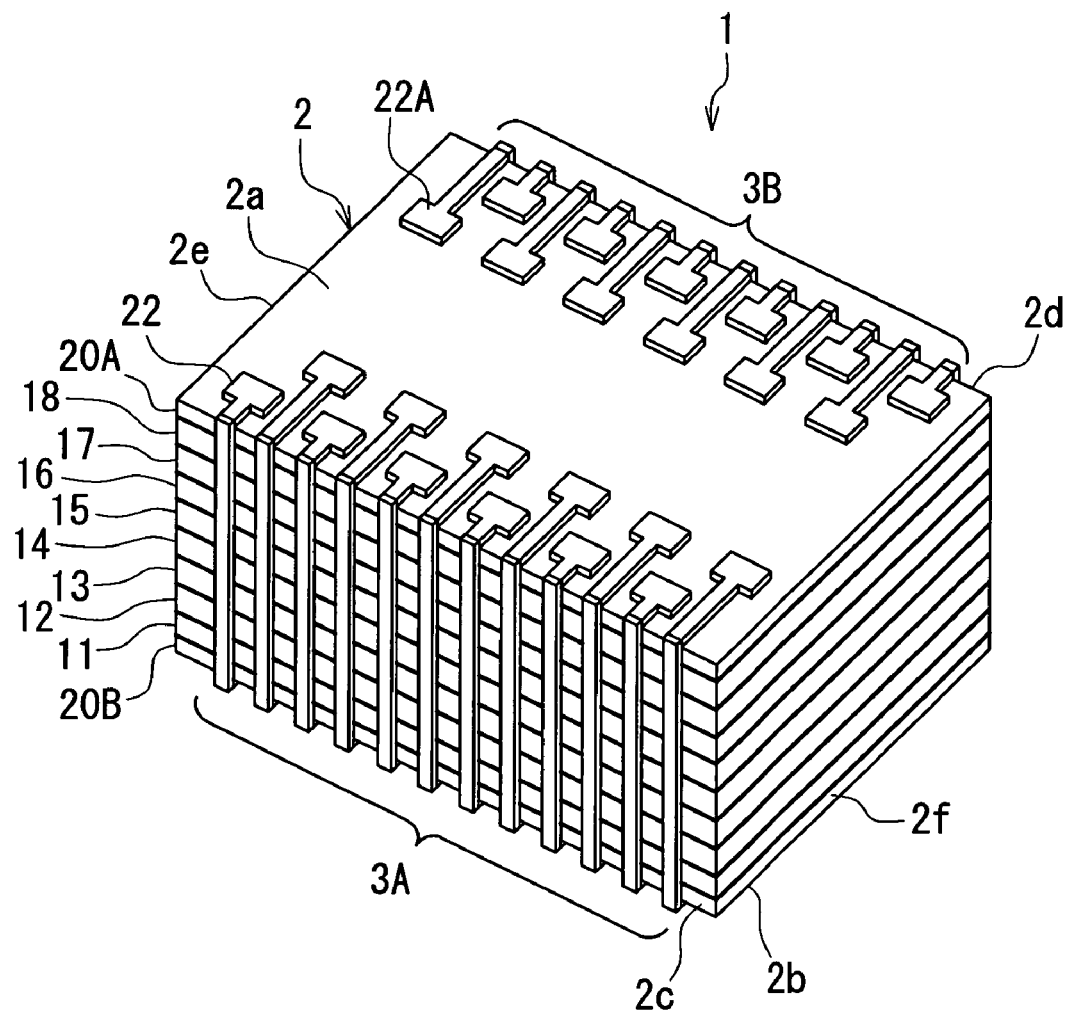
FIG. 1 is a perspective view of a layered chip package of a first embodiment of the invention.
Figure 2:
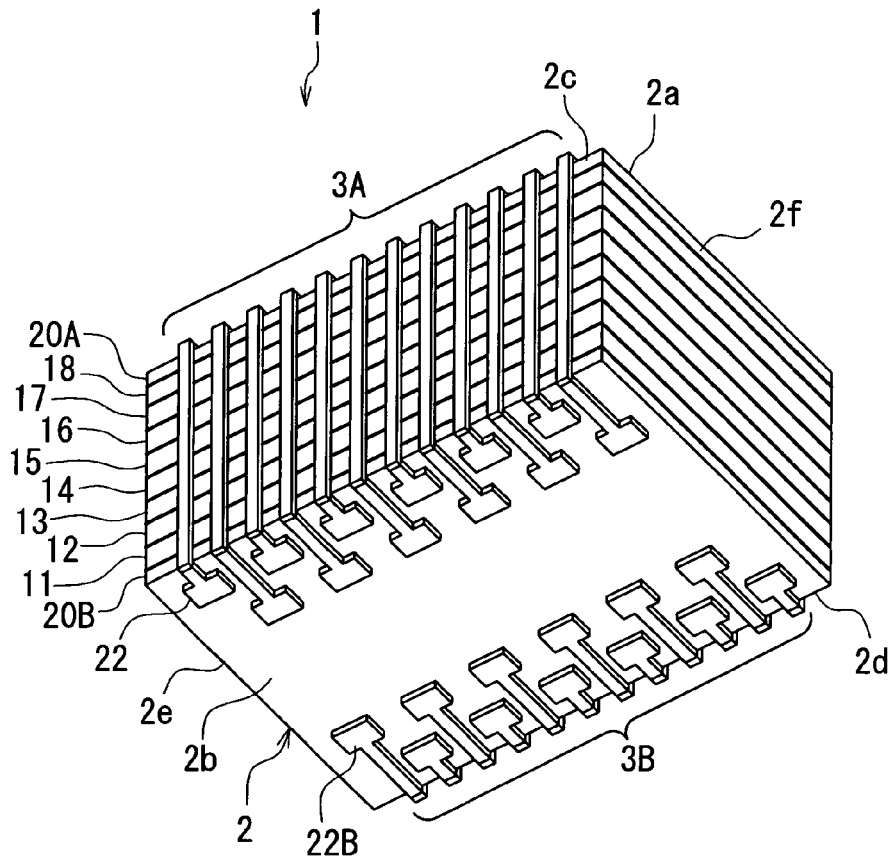
FIG. 2 is a perspective view of the layered chip package of FIG. 1 as seen from the bottom surface.

Embodiments of the present invention will now be described in detail with reference to the drawings. Reference is first made to FIG. 1 and FIG. 2 to describe the configuration of a layered chip package of a first embodiment of the invention. FIG. 1 is a perspective view of the layered chip package of the first embodiment. FIG. 2 is a perspective view of the layered chip package of FIG. 1 as seen from the bottom surface. As shown in FIG. 1 and FIG. 2, the layered chip package 1 of the first embodiment includes a main body 2 that is rectangular-solid-shaped. The main body 2 has a top surface 2a, a bottom surface 2b, a first side surface 2c and a second side surface 2d facing toward opposite directions, and a third side surface 2e and a fourth side surface 2f facing toward opposite directions.

The layered chip package 1 further includes wiring disposed on at least one of the side surfaces of the main body 2. In the example shown in FIG. 1 and FIG. 2, the layered chip package 1 includes first wiring 3A disposed on the first side surface 2c of the main body 2, and second wiring 3B disposed on the second side surface 2d of the main body 2.

The layered chip package 1 further includes a plurality of pad-shaped first terminals 22A disposed on the top surface 2a of the main body 2, and a plurality of pad-shaped second terminals 22B disposed on the bottom surface 2b of the main body 2.

The main body 2 includes a plurality of layer portions stacked. By way of example, FIG. 1 and FIG. 2 show that the main body 2 includes eight layer portions 11, 12, 13, 14, 15, 16, 17 and 18 that are stacked in this order from the bottom. The number of the layer portions to be included in the main body 2 is not limited to eight, and may be any plural number. In the following description, any layer portion is represented by reference numeral 10.

The main body 2 further includes a terminal layer 20A disposed on the uppermost layer portion 18, and a terminal layer 20B disposed below the lowermost layer portion 11. Every vertically adjacent two of the layer portions are bonded to each other with an adhesive, so are the layer portion 18 and the terminal layer 20A to each other, and so are the layer portion 11 and the terminal layer 20B to each other. The layer portions 11 to 18 and the terminal layers 20A and 20B each have a top surface, a bottom surface, and four side surfaces. The plurality of first terminals 22A are disposed on the top surface of the terminal layer 20A. The plurality of second terminals 22B are disposed on the bottom surface of the terminal layer 20B. The first terminals 22A and the second terminals 22B function as external connecting terminals of the layered chip package 1.

Some of the first terminals 22A each have an end face located at the position corresponding to the side surface 2c of the main body 2, and the first wiring 3A is connected to these end faces. Other some of the first terminals 22A each have an end face located at the position corresponding to the side surface 2d of the main body 2, and the second wiring 3B is connected to these end faces.

Similarly, some of the second terminals 22B each have an end face located at the position corresponding to the side surface 2c of the main body 2, and the first wiring 3A is connected to these end faces. Other some of the second terminals 22B each have an end face located at the position corresponding to the side surface 2d of the main body 2, and the second wiring 3B is connected to these end faces.

The layered chip package 1 may further include: a first overcoat layer that is formed of an insulating material such as a resin and covers the top surface 2a of the main body 2 and the first terminals 22A and a second overcoat layer that is formed of an insulating material such as a resin and covers the bottom surface 2b of the main body 2 and the second terminals 22B. In this case, a plurality of openings for exposing respective portions of the first terminals 22A are formed in the first overcoat layer, and a plurality of openings for exposing respective portions of the second terminals 22B are formed in the second overcoat layer.

Figure 8:
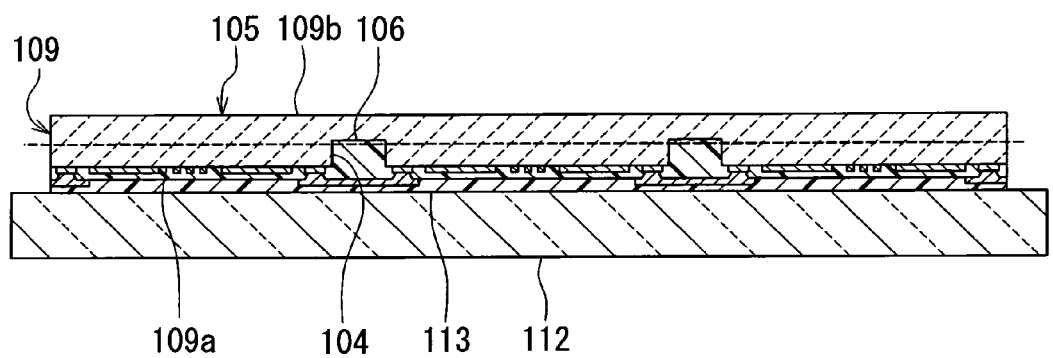
FIG. 8 is a cross-sectional view of a portion of a structure fabricated in a step that follows the step of FIG. 7.
Figure 9:
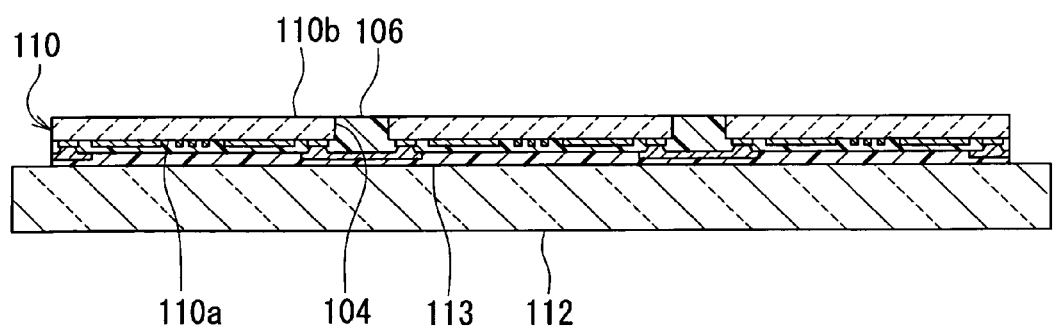
FIG. 9 is a cross-sectional view of a portion of a substructure fabricated in a step that follows the step of FIG. 8.
Figure 10:
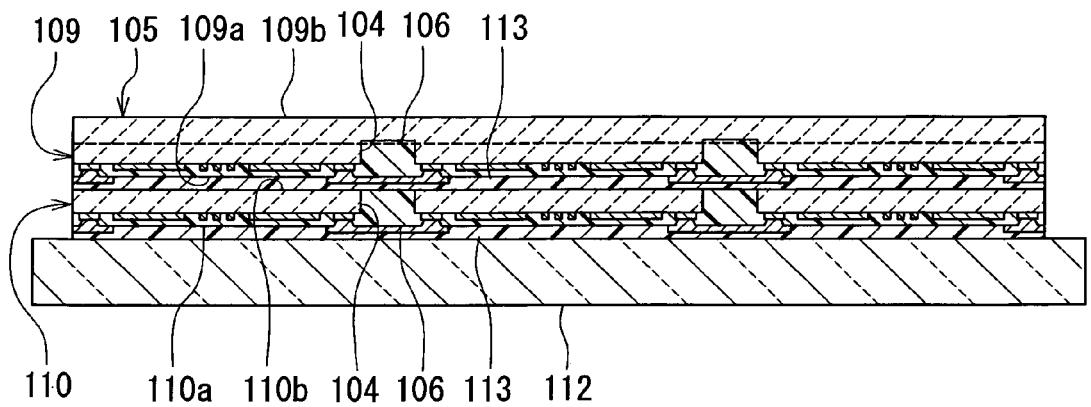
FIG. 10 is a cross-sectional view of a portion of a stack of layers fabricated in a step that follows the step of FIG. 9.

Each of the first and second pre-substrate wafers 101 is fabricated through the step described with reference to FIG. 4. Each of the first and second pre-polishing substructures 109 is fabricated through the steps described with reference to FIG. 5 to FIG. 7. In the step of bonding the first pre-polishing substructure 109 to the jig 112, as shown in FIG. 8, the first pre-polishing substructure 109 is bonded to the jig 112 such that the first surface 109a of the first pre-polishing substructure 109 faces the jig 112. In the first polishing step, as shown in FIG. 8 and FIG. 9, the second surface 109b of the first pre-polishing substructure 109 is polished so that the first pre-polishing substructure 109 is thinned by the polishing and thereby the first substructure 110 is formed in the state of being bonded to the jig 112. In the step of bonding the second pre-polishing substructure 109 to the first substructure 110, as shown in FIG. 10, the second pre-polishing substructure 109 is bonded to the first substructure 110 such that the first surface 109a of the second pre-polishing substructure 109 faces the polished surface, that is, the second surface 110b, of the first substructure 110. In the second polishing step, the second surface 109b of the second pre-polishing substructure 109 is polished so that the second pre-polishing substructure 109 is thinned by the polishing and thereby the second substructure 110 is formed in the state of being stacked on the first substructure 110.

The module of the fourth example includes the components of the module of the third example except the molded resin 217. The module of the fourth example further includes connecting portions 231 made of a conductor and disposed on the wiring 216, and an insulating layer 232 disposed around the connecting portions 231 and covering the wiring 216 and the plurality of layered chip packages 1 shown in FIG. 38.

Figure 3:
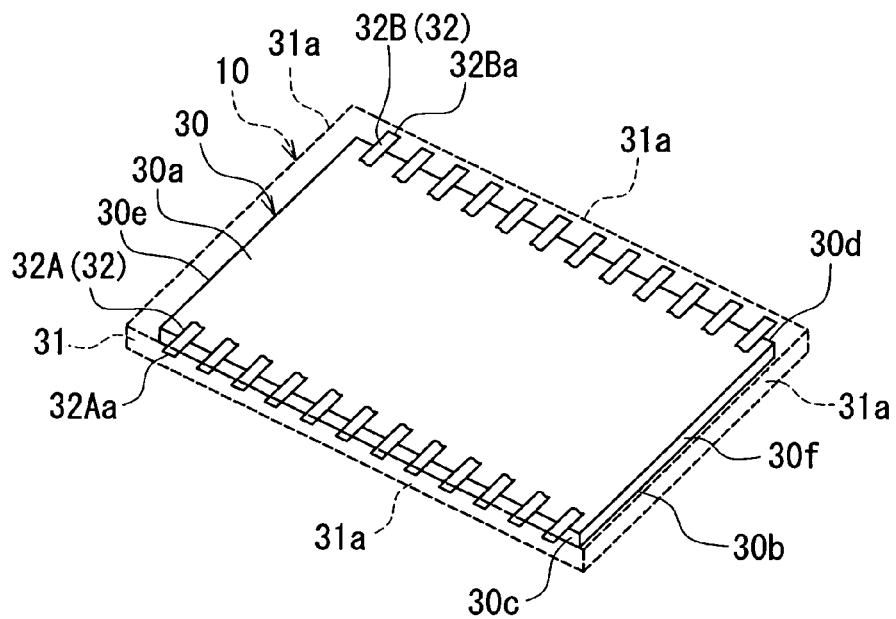
FIG. 3 is a perspective view of one of layer portions included in the layered chip package of FIG. 1.

FIG. 3 is a perspective view of one layer portion 10. As shown in FIG. 3, the layer portion 10 includes a semiconductor chip 30. The semiconductor chip 30 has a top surface 30a, a bottom surface 30b, a first side surface 30c and a second side surface 30d facing toward opposite directions, and a third side surface 30e and a fourth side surface 30f facing toward opposite directions. The side surfaces 30c, 30d, 30e and 30f respectively face toward the side surfaces 2c, 2d, 2e and 2f of the main body 2.

The layer portion 10 further includes: an insulating portion 31 covering at least one of the four side surfaces of the semiconductor chip 30; and a plurality of electrodes 32 connected to the semiconductor chip 30. The insulating portion 31 has at least one end face 31a located at the at least one of the side surfaces of the main body 2 on which the wiring is disposed. In the example shown in FIG. 3, the insulating portion 31 covers all of the four side surfaces of the semiconductor chip 30, and has four end faces 31a that are respectively located at the four side surfaces of the main body 2. In this example, the insulating portion 31 further covers the top surface 30a of the semiconductor chip 30.

In the example shown in FIG. 3, the plurality of electrodes 32 include a plurality of first electrodes 32A and a plurality of second electrodes 32B. Each of the plurality of first electrodes 32A has an end face 32Aa that is located at the first side surface 2c of the main body 2 and surrounded by the insulating portion 31. Each of the plurality of second electrodes 32B has an end face 32Ba that is located at the second side surface 2d of the main body 2 and surrounded by the insulating portion 31. The first wiring 3A disposed on the first side surface 2c of the main body 2 is connected to the end faces 32Aa of the plurality of first electrodes 32A of a plurality of layer portions 10. The second wiring 3B disposed on the second side surface 2d of the main body 2 is connected to the end faces 32Ba of the plurality of second electrodes 32B of the plurality of layer portions 10. In the following description, any electrode is represented by reference numeral 32, and the end face of any electrode 32 is represented by reference numeral 32a.

The semiconductor chip 30 may be a memory chip constituting a memory such as a flash memory, DRAM, SRAM, MRAM, PROM or FeRAM. In this case, a large-capacity memory is provided by the layered chip package 1 including a plurality of semiconductor chips 30. Furthermore, according to the layered chip package 1 of the present embodiment, it is possible to easily provide memory of various capacities such as 64 GB (gigabytes), 128 GB and 256 GB by changing the number of the semiconductor chips 30 included in the layered chip package 1.

The layered chip package 1 may include a plurality of semiconductor chips 30 serving as memory chips that constitute different types of memory. The layered chip package 1 may include a semiconductor chip 30 serving as a memory chip, and another semiconductor chip 30 serving as a controller for controlling the memory chip.

The semiconductor chips 30 are not limited to memory chips, and may provide other devices such as CPUs, sensors, and driving circuits for sensors. The layered chip package 1 of the present embodiment is particularly suitable for providing an SiP.

If the yield of the semiconductor chips 30 is high, the number of the layer portions to be included in the main body 2 may be as large as, for example, eight or sixteen, because there is a low possibility that reworking (remaking) of the layered chip package 1 will be required due to the presence of defective semiconductor chips 30 in the layered chip package 1. On the other hand, if the yield of the semiconductor chips 30 is low, it is preferred that the number of the layer portions to be included in the main body 2 be as small as, for example, two or four, so as to facilitate reworking of the layered chip package 1.

A manufacturing method for the layered chip package 1 of the present embodiment will now be described. The manufacturing method for the layered chip package 1 of the present embodiment includes the steps of: fabricating a plurality of substructures that respectively correspond to the plurality of layer portions 10 of the layered chip package 1, each substructure including a plurality of its corresponding layer portions 10 and being intended to be cut later at a boundary between every adjacent ones of the plurality of its corresponding layer portions 10; and completing the layered chip package 1 by fabricating the main body 2 using the plurality of substructures and by forming the first terminals 22A, the second terminals 22B and the wiring 3A, 3B on the main body 2. The plurality of substructures may each include a plurality of layer portions 10 of the same kind.

The step of completing the layered chip package 1 includes the step of fabricating a layered substructure by stacking the plurality of substructures into a stack and providing a plurality of groups of first terminals 22A and a plurality of groups of second terminals 22B on the stack, wherein the plurality of substructures are stacked in correspondence with the order of stacking of the plurality of layer portions 10 of the layered chip package 1.

With reference to FIG. 4 to FIG. 20, a detailed description will now be made on the step of fabricating the layered substructure in the manufacturing method for the layered chip package 1 of the present embodiment. In the step of fabricating the layered substructure, first, a plurality of pre-substructure wafers that respectively correspond to the plurality of layer portions 10 of the layered chip package 1 are fabricated.

Figure 4:
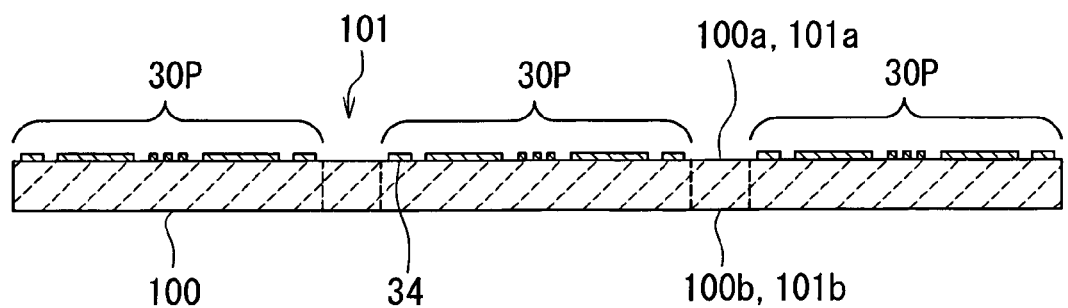
FIG. 4 is a cross-sectional view of a portion of a pre-substructure wafer fabricated in a step of a manufacturing method for the layered chip package of the first embodiment of the invention.

FIG. 4 shows a step of fabricating a single pre-substructure wafer. In this step, a semiconductor wafer 100 having a first surface 100a and a second surface 100b that face toward opposite directions is subjected to processing, such as a wafer process, at the first surface 100a, to thereby fabricate a pre-substructure wafer 101 that includes a plurality of pre-semiconductor-chip portions 30P aligned. The plurality of pre-semiconductor-chip portions 30P each include a device, and are to become the plurality of semiconductor chips 30 later. The plurality of pre-semiconductor-chip portions 30P of the pre-substructure wafer 101 may later become a plurality of the same kind of semiconductor chips 30. The pre-substructure wafer 101 has a first surface 101a corresponding to the first surface 100a of the semiconductor wafer 100, and a second surface 101b corresponding to the second surface 100b of the semiconductor wafer 100. In the pre-substructure wafer 101, the plurality of pre-semiconductor-chip portions 30P may be aligned in a row, or may be aligned in a plurality of rows such that a plurality of ones of the pre-semiconductor-chip portions 30P are aligned in each of vertical and horizontal directions. In the following description, it is assumed that the plurality of pre-semiconductor-chip portions 30P are aligned in a plurality of rows such that a plurality of ones of the pre-semiconductor-chip portions 30P are aligned in each of vertical and horizontal directions in the pre-substructure wafer 101.

The semiconductor wafer 100 may be a silicon wafer, for example. The wafer process is a process in which a wafer is processed into a plurality of devices that are not yet separated into a plurality of chips. In the pre-substructure wafer 101, the first surface 101a is a device formation surface on which devices are formed. Each of the plurality of pre-semiconductor-chip portions 30P has a plurality of pad-shaped electrodes 34 disposed on the first surface 101a of the pre-substructure wafer 101.

Figure 13:
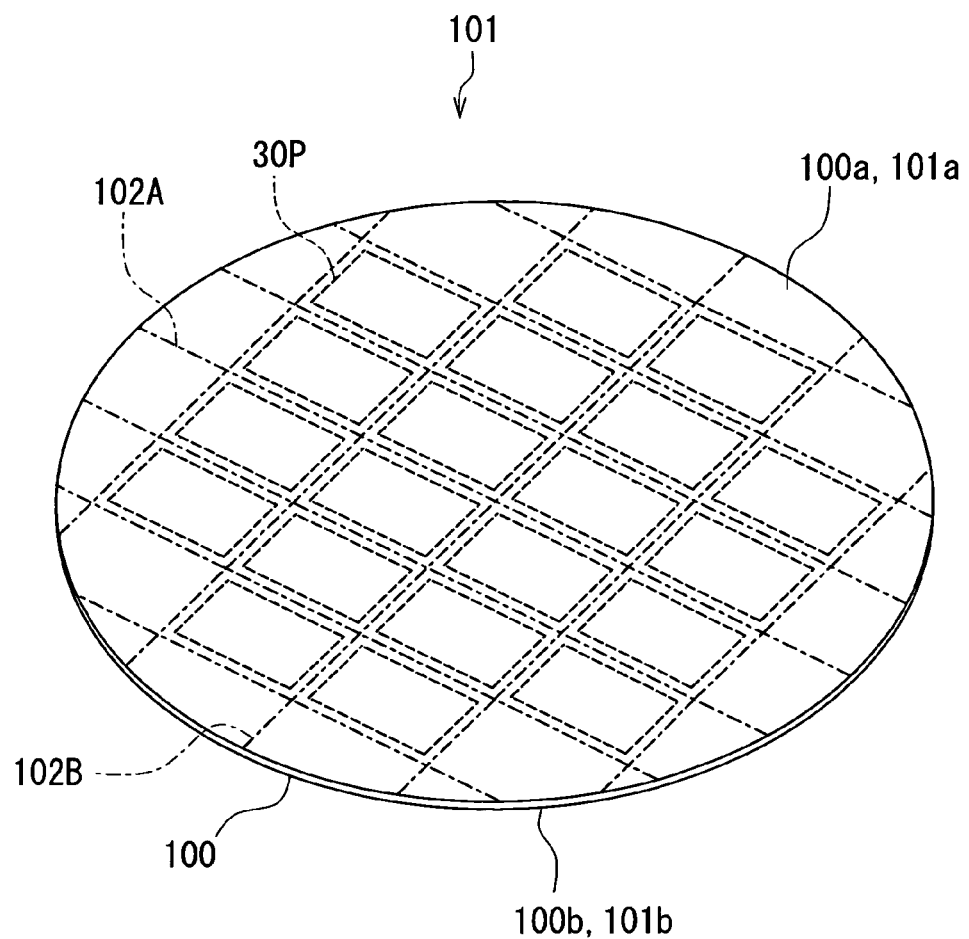
FIG. 13 is a perspective view of the pre-substructure wafer fabricated in the step of FIG. 4.

FIG. 13 is a perspective view of the pre-substructure wafer 101. As shown in FIG. 13, the pre-substructure wafer 101 is provided with a plurality of scribe lines 102A and a plurality of scribe lines 102B. The scribe lines 102A extend horizontally to pass through boundaries between every two pre-semiconductor-chip portions 30P that are vertically adjacent to each other. The scribe lines 102B extend vertically to pass through boundaries between every two pre-semiconductor-chip portions 30P that are horizontally adjacent to each other.

Figure 14:
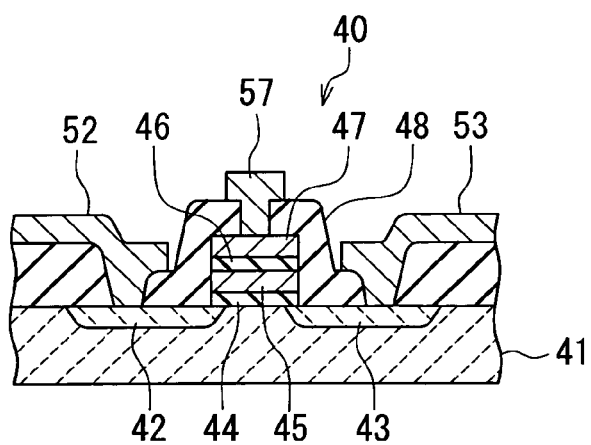
FIG. 14 is a cross-sectional view illustrating an example of the internal structure of a pre-semiconductor-chip portion of the pre-substructure wafer of FIG. 13.

FIG. 14 is a cross-sectional view illustrating an example of the internal structure of each pre-semiconductor-chip portion 30P of the pre-substructure wafer 101 of FIG. 13. Here is given an example in which a plurality of memory cells of a flash memory are formed as a device in the pre-semiconductor-chip portion 30P. FIG. 14 shows one of the plurality of memory cells as a device formed in the pre-semiconductor-chip portion 30P. The memory cell 40 includes a source 42 and a drain 43 formed near a surface of a P-type silicon substrate 41 composed of the semiconductor wafer 100, i.e., near the first surface 100a of the semiconductor wafer 100. The source 42 and the drain 43 are both N-type regions. The source 42 and the drain 43 are disposed at a predetermined distance from each other so that a channel composed of a portion of the P-type silicon substrate 41 is provided between the source 42 and the drain 43. The memory cell 40 further includes an insulating film 44, a floating gate 45, an insulating film 46 and a control gate 47 that are stacked in this order on the surface of the substrate 41 at the location between the source 42 and the drain 43. The memory cell 40 further includes an insulating layer 48 covering the source 42, the drain 43, the insulating film 44, the floating gate 45, the insulating film 46 and the control gate 47. The insulating layer 48 has contact holes that open at the tops of the source 42, the drain 43 and the control gate 47, respectively. The memory cell 40 includes a source electrode 52, a drain electrode 53, and a control gate electrode 57 that are formed on the insulating layer 48 at locations above the source 42, the drain 43 and the control gate 47, respectively. The source electrode 52, the drain electrode 53 and the control gate electrode 57 are connected to the source 42, the drain 43 and the control gate 47, respectively, through the respective contact holes.

A plurality of pre-substructure wafers 101 that respectively correspond to the plurality of layer portions 10 of the layered chip package 1 are each fabricated through the step described with reference to FIG. 4.

Figure 5:
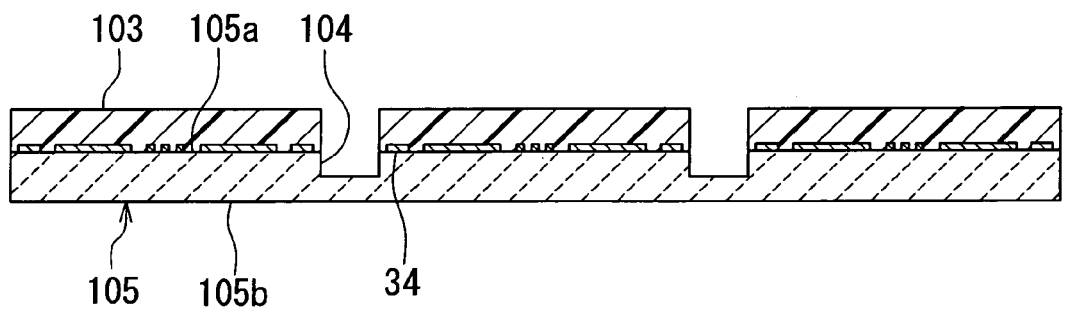
FIG. 5 is a cross-sectional view of a portion of a pre-polishing substructure main body fabricated in a step that follows the step of FIG. 4.

FIG. 5 shows a step that follows the step of FIG. 4. In this step, first, a protection film 103 made of, for example, photoresist, is formed to cover the entire first surface 101a of the pre-substructure wafer 101. Next, at least one groove 104 is formed in the pre-substructure wafer 101. The at least one groove 104 opens at the first surface 101a of the pre-substructure wafer 101 and extends to be adjacent to at least one of the pre-semiconductor-chip portions 30P. Here, a plurality of grooves 104 are formed as shown in FIG. 5. At the positions of the boundaries between every two adjacent pre-semiconductor-chip portions 30P, the grooves 104 are formed to pass through the boundaries between every two adjacent pre-semiconductor-chip portions 30P. In this way, a pre-polishing substructure main body 105 is formed by the pre-substructure wafer 101 having undergone the formation of the plurality of grooves 104 therein. The pre-polishing substructure main body 105 includes the plurality of pre-semiconductor-chip portions 30P. The pre-polishing substructure main body 105 has a first surface 105a and a second surface 105b. The first surface 105a corresponds to the first surface 100a of the semiconductor wafer 100 and the first surface 101a of the pre-substructure wafer 101. The second surface 105b corresponds to the second surface 100b of the semiconductor wafer 100 and the second surface 101b of the pre-substructure wafer 101. The pre-polishing substructure main body 105 further has the plurality of grooves 104 that open at the first surface 105a. In the pre-polishing substructure main body 105, the first surface 105a is a device formation surface on which devices are formed.

The plurality of grooves 104 are formed along the scribe lines 102A and 102B shown in FIG. 13. The grooves 104 are formed such that their bottoms do not reach the second surface 101b of the pre-substructure wafer 101. The grooves 104 are each 10 to 150 µm wide, for example. The grooves 104 are each 30 to 150 µm deep, for example. The grooves 104 may be formed using a dicing saw, or by etching such as reactive ion etching.

Figure 15:
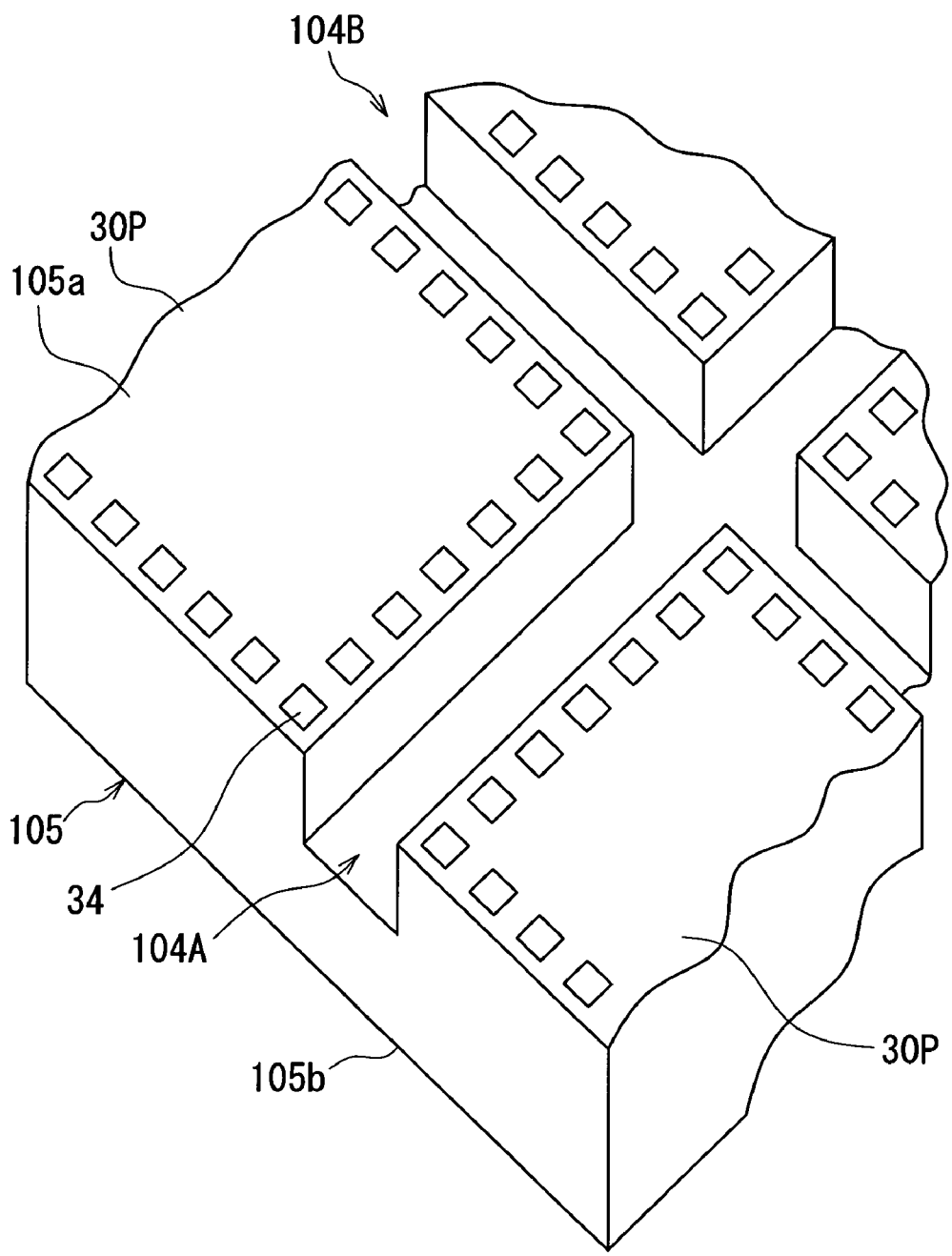
FIG. 15 is a perspective view of a portion of the pre-polishing substructure main body fabricated in the step of FIG. 5.

FIG. 15 shows a portion of the pre-polishing substructure main body 105 fabricated in the step of FIG. 5. In the present embodiment, the plurality of grooves 104 include a plurality of first grooves 104A and a plurality of second grooves 104B. The first grooves 104A and the second grooves 104B extend in directions orthogonal to each other. FIG. 15 shows only one each of the first and second grooves 104A and 104B. The first grooves 104A are formed along the scribe lines 102A shown in FIG. 13, and the second grooves 104B are formed along the scribe lines 102B shown in FIG. 13.

Figure 6:
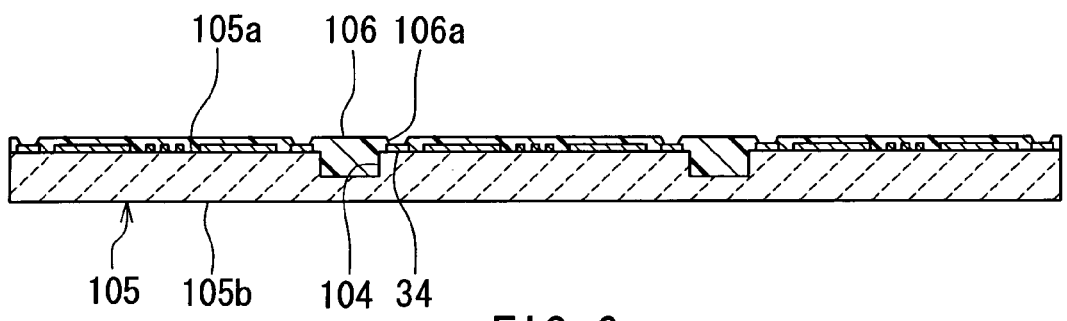
FIG. 6 is a cross-sectional view of a portion of a structure fabricated in a step that follows the step of FIG. 5.

FIG. 6 shows a step that follows the step of FIG. 5. In this step, first, an insulating layer 106 is formed to fill the plurality of grooves 104 of the pre-polishing substructure main body 105 and to cover the plurality of pad-shaped electrodes 34. The insulating layer 106 will later become part of the insulating portion 31. Next, a plurality of openings 106a for exposing the pad-shaped electrodes 34 are formed in the insulating layer 106.

The insulating layer 106 may be formed of a resin such as an epoxy resin or a polyimide resin. The insulating layer 106 may also be formed of a photosensitive material such as a polyimide resin containing a sensitizer. If the insulating layer 106 is formed of a photosensitive material, the openings 106a of the insulating layer 106 may be formed by photolithography. If the insulating layer 106 is formed of a non-photosensitive material, the openings 106a of the insulating layer 106 may be formed by selectively etching the insulating layer 106.

The insulating layer 106 may include a first layer that fills the grooves 104, and a second layer that covers the first layer and the pad-shaped electrodes 34. In this case, the openings 106a are formed in the second layer. Both of the first layer and the second layer may be formed of a resin such as an epoxy resin or a polyimide resin. The second layer may be formed of a photosensitive material such as a polyimide resin containing a sensitizer. If the second layer is formed of a photosensitive material, the openings 106a may be formed in the second layer by photolithography. If the second layer is formed of a non-photosensitive material, the openings 106a may be formed in the second layer by selectively etching the second layer.

It is preferable that the insulating layer 106 be formed of a resin having a low thermal expansion coefficient. Forming the insulating layer 106 of a resin having a low thermal expansion coefficient serves to facilitate cutting of the insulating layer 106 when the insulating layer 106 is cut later with a dicing saw.

It is preferable that the insulating layer 106 be transparent. If the insulating layer 106 is transparent, it is possible to easily recognize alignment marks that will be formed on the insulating layer 106 later, through the insulating layer 106.

Figure 7:
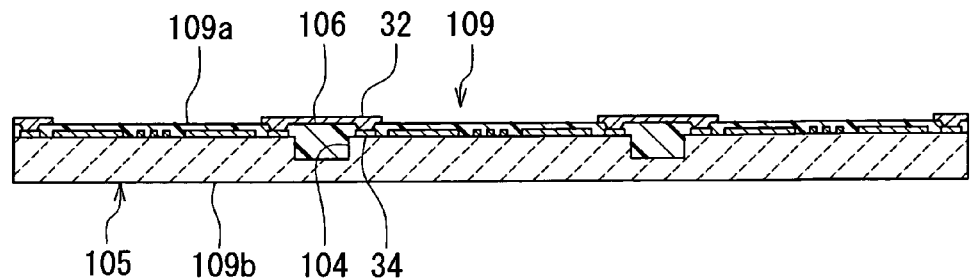
FIG. 7 is a cross-sectional view of a portion of a pre-polishing substructure fabricated in a step that follows the step of FIG. 6.
Figure 16:
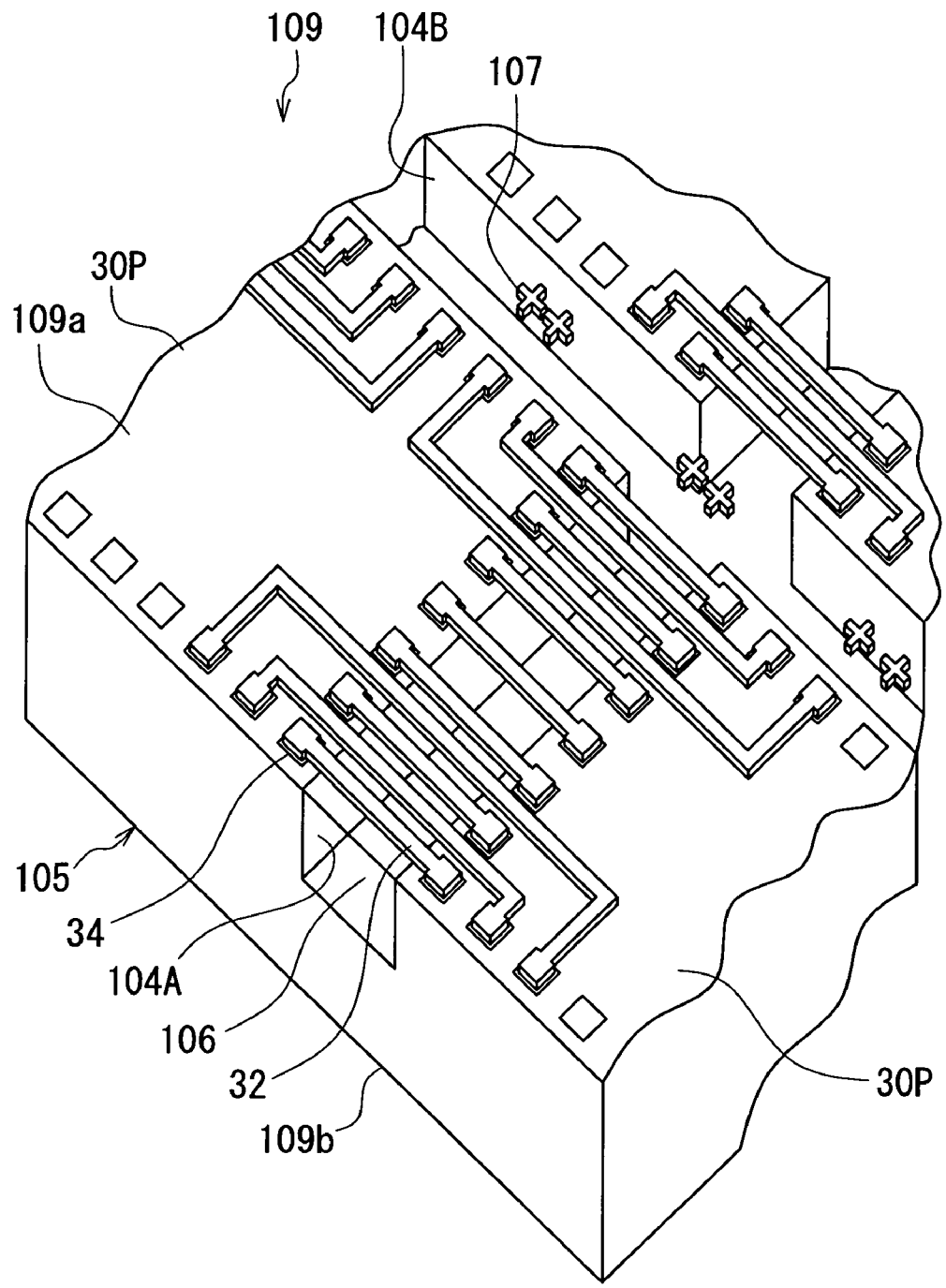
FIG. 16 is a perspective view of a portion of the pre-polishing substructure fabricated in the step of FIG. 7.

FIG. 7 shows a step that follows the step of FIG. 6. In this step, the plurality of electrodes 32 are formed such that part of each of the electrodes 32 lies on the insulating layer 106. The electrodes 32 are connected to the pad-shaped electrodes 34 through the openings 106a. FIG. 16 shows a portion of the structure fabricated in the step of FIG. 7. FIG. 7 and FIG. 16 show an example in which electrodes 32 extending from one of two adjacent pre-semiconductor-chip portions 30P are coupled to those extending from the other of the two adjacent pre-semiconductor-chip portions 30P. However, it is not necessarily required that electrodes 32 extending from one of two adjacent pre-semiconductor-chip portions 30P be coupled to those extending from the other of the two adjacent pre-semiconductor-chip portions 30P.

The electrodes 32 are formed of a conductive material such as Cu. The electrodes 32 are formed by frame plating, for example. In this case, first, a seed layer for plating is formed on the insulating layer 106. Next, a frame having grooves is formed on the seed layer. The frame is formed by patterning a photoresist layer by photolithography, for example. Next, plating layers to become part of the electrodes 32 are formed by plating on the seed layer in the grooves of the frame. Next, the frame is removed and the seed layer except portions thereof located below the plating layers is also removed. As a result, the electrodes 32 are formed of the plating layers and the portions of the seed layer remaining therebelow.

As shown in FIG. 16, in the step of forming the plurality of electrodes 32, a plurality of alignment marks 107 are formed on the insulating layer 106 simultaneously with the formation of the plurality of electrodes 32. The alignment marks 107 are disposed above the grooves 104. The material and forming method of the alignment marks 107 are the same as those of the electrodes 32.

A pre-polishing substructure 109 shown in FIG. 7 and FIG. 16 is thus fabricated. The pre-polishing substructure 109 includes: the pre-polishing substructure main body 105; the insulating layer 106 that fills the grooves 104 of the pre-polishing substructure main body 105 and that will later become part of the insulating portion 31; the plurality of electrodes 32 each having a portion lying on the insulating layer 106; and the plurality of alignment marks 107 disposed on the insulating layer 106. The pre-polishing substructure 109 has a first surface 109a and a second surface 109b. The first surface 109a corresponds to the first surface 100a of the semiconductor wafer 100 and the first surface 101a of the pre-substructure wafer 101. The second surface 109b corresponds to the second surface 100b of the semiconductor wafer 100 and the second surface 101b of the pre-substructure wafer 101.

A plurality of pre-polishing substructures 109 that respectively correspond to the plurality of layer portions 10 of the layered chip package 1 are each fabricated through the steps described with reference to FIG. 5 to FIG. 7.

FIG. 8 shows a step that follows the step of FIG. 7. In this step, a pre-polishing substructure 109 is bonded to a plate-shaped jig 112 shown in FIG. 8 with an insulating adhesive such that the first surface 109a of the pre-polishing substructure 109 faces a surface of the jig 112. The pre-polishing substructure 109 bonded to the jig 112 will be hereinafter called a first pre-polishing substructure 109. The pre-substructure wafer 101 serving as a basis for fabricating the first pre-polishing substructure 109 will be hereinafter called a first pre-substructure wafer 101. An insulating layer 113 formed by the adhesive covers the electrodes 32 and will become part of the insulating portion 31. It is preferred that the insulating layer 113 be transparent.

Next, the second surface 109b of the first pre-polishing substructure 109 is polished. This polishing is performed until the plurality of grooves 104 become exposed. In FIG. 8 the broken line indicates the position of the surface 109b after the polishing. As a result of polishing the second surface 109b of the first pre-polishing substructure 109, the first pre-polishing substructure 109 is thinned by the polishing and thereby a substructure 110 is formed in the state of being bonded to the jig 112. The substructure 110 has a thickness of, for example, 30 to 100 μm.

FIG. 9 shows the substructure 110 bonded to the jig 112. The substructure 110 bonded to the jig 112 will be hereinafter called a first substructure 110. The first substructure 110 has a first surface 110a corresponding to the first surface 109a of the first pre-polishing substructure 109, and a second surface 110b opposite to the first surface 110a. The second surface 110b is the polished surface.

Figure 17:
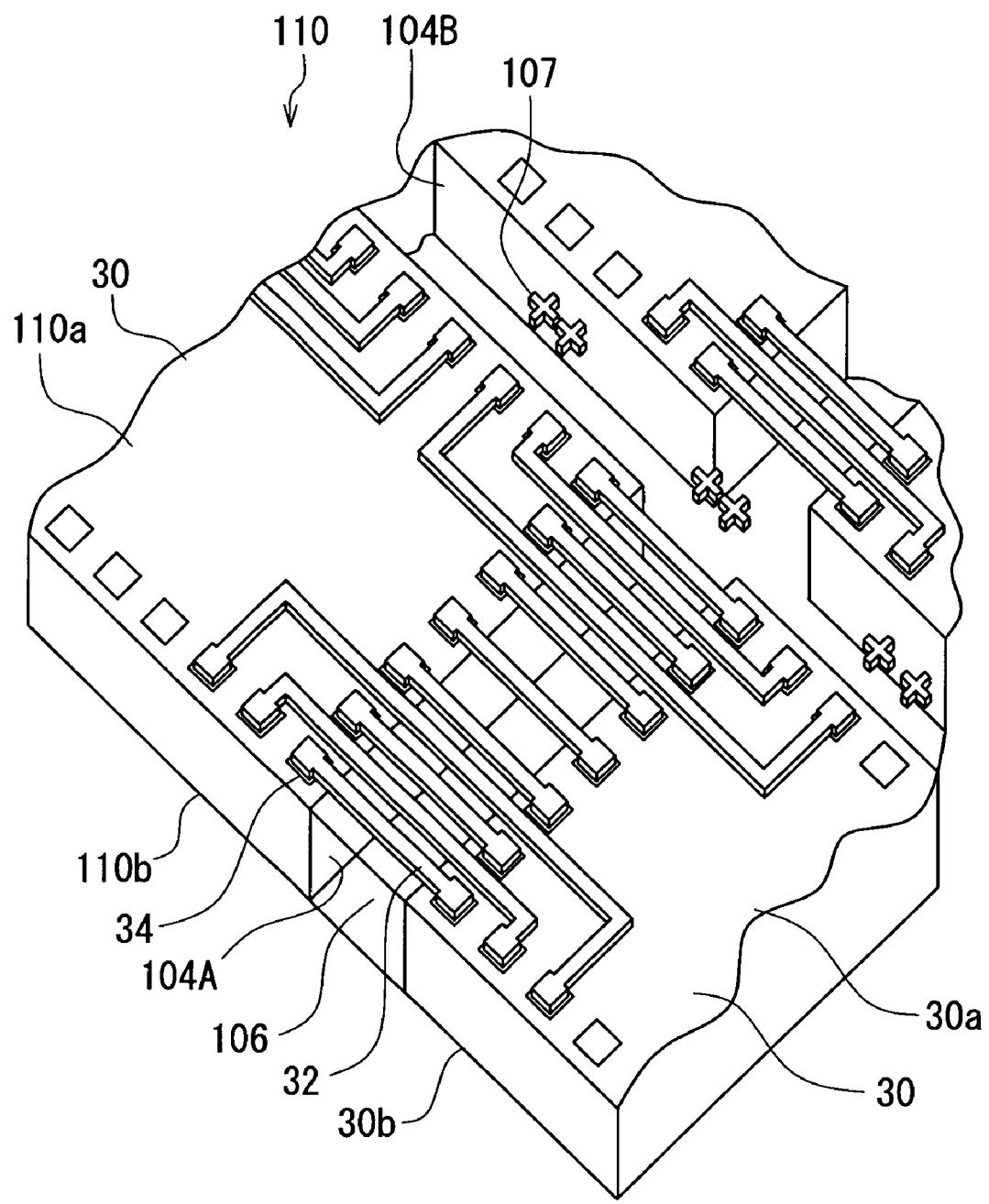
FIG. 17 is a perspective view of a portion of the substructure fabricated in the step of FIG. 9.

FIG. 17 shows a portion of the first substructure 110 fabricated in the step of FIG. 9. As previously described, by polishing the second surface 109b of the first pre-polishing substructure 109 until the grooves 104 become exposed, the plurality of pre-semiconductor-chip portions 30P are separated from each other and thereby become the semiconductor chips 30.

FIG. 10 shows a step that follows the step of FIG. 9. In this step, a pre-polishing substructure 109 is bonded with an insulating adhesive to the first substructure 110 bonded to the jig 112. The pre-polishing substructure 109 is bonded to the first substructure 110 such that the first surface 109a faces the polished surface, that is, the second surface 110b, of the first substructure 110. The pre-polishing substructure 109 to be bonded to the first substructure 110 will be hereinafter called a second pre-polishing substructure 109. The pre-substructure wafer 101 serving as a basis for fabricating the second pre-polishing substructure 109 will be hereinafter called a second pre-substructure wafer 101. An insulating layer 113 formed by the adhesive covers the electrodes 32 and will become part of the insulating portion 31. It is preferred that the insulating layer 113 be transparent.

Next, the second surface 109b of the second pre-polishing substructure 109 is polished. This polishing is performed until the plurality of grooves 104 become exposed. In FIG. 10 the broken line indicates the position of the surface 109b after the polishing. As a result of polishing the second surface 109b of the second pre-polishing substructure 109, the second pre-polishing substructure 109 is thinned by the polishing and thereby a substructure 110 is formed in the state of being stacked on the first substructure 110. This substructure 110 stacked on the first substructure 110 will be hereinafter called a second substructure 110.

Figure 11:
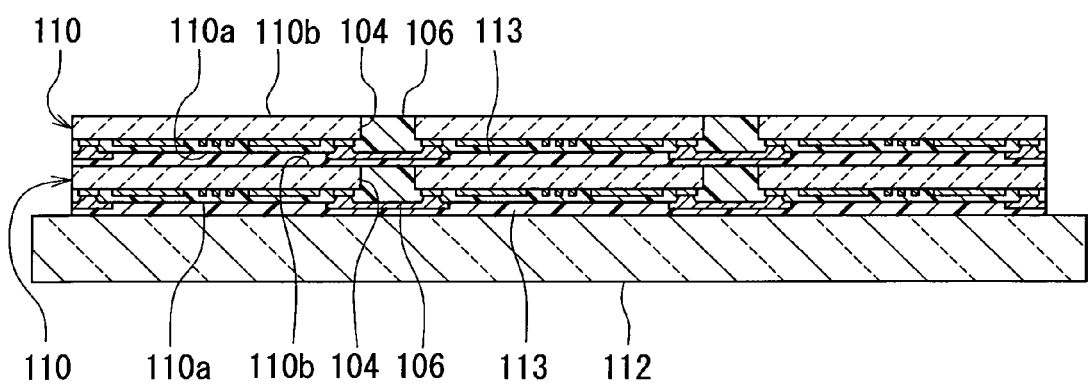
FIG. 11 is a cross-sectional view of a portion of a stack of layers fabricated in a step that follows the step of FIG. 10.

FIG. 11 shows a state in which the second surface 109b of the second pre-polishing substructure 109 has been polished and the first and second substructures 110 have been stacked on the jig 112. The second substructure 110 has a first surface 110a corresponding to the first surface 109a of the second pre-polishing substructure 109, and a second surface 110b opposite to the first surface 110a. The second surface 110b is the polished surface. The second substructure 110 has a thickness of, for example, 30 to 100 μm, as does the first substructure 110.

Here, if the insulating layers 106 and 113 are transparent, using a transparent jig such as an acrylic plate or a glass plate as the jig 112 makes it possible that the alignment marks 107 of the first substructure 110 and the second pre-polishing substructure 109 are visible from the outside of the jig 112 when the second pre-polishing substructure 109 is bonded to the first substructure 110. As a result, it is possible, through the use of the alignment marks 107, to perform alignment of the first substructure 110 and the second pre-polishing substructure 109.

Figure 12:
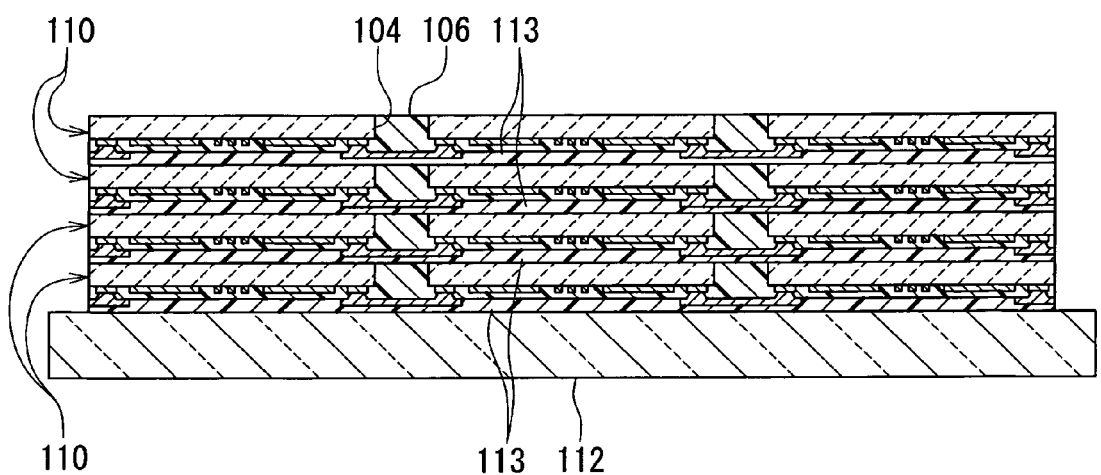
FIG. 12 is a cross-sectional view of a portion of a stack of layers fabricated in a step that follows the step of FIG. 11.

One or more additional substructures 110 may be stacked on the second substructure 110 by repeating the steps shown in FIG. 10 and FIG. 11 so that a total of three or more substructures 110 may be stacked on the jig 112. Here, by way of example, four substructures 110 shall be stacked on the jig 112 as shown in FIG. 12. In the present embodiment, the number of the substructures 110 to be stacked on the jig 112 may be any plural number.

Figure 18:
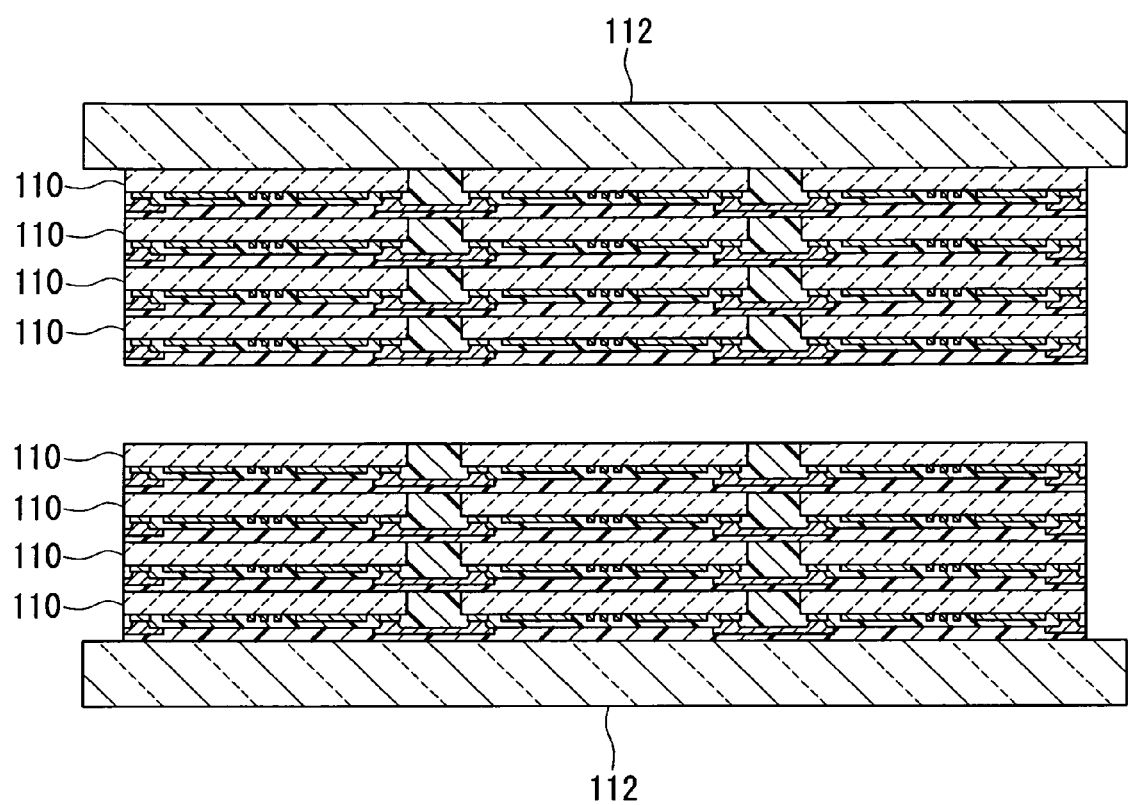
FIG. 18 is an illustrative view showing a step that follows the step of FIG. 12.

FIG. 18 shows a step that follows the step of FIG. 12. In this step, two stacks each of which includes four substructures 110 are prepared and the two stacks are bonded to each other to thereby fabricate a stack including eight substructures 110. The two stacks each including four substructures 110 are each fabricated through the steps shown in FIG. 8 to FIG. 12. The combination of the jig 112 and the stack of four substructures 110 shown on the upper side of FIG. 18 is fabricated by separating the jig 112 from the stack shown in FIG. 12 and then bonding the jig 112 to a surface of this stack opposite to the surface to which the jig 112 was initially bonded. In this way, by re-bonding the jig 112 for one of the two stacks to be bonded to each other, it is possible to stack eight substructures 110 such that the upper and lower positional relationship between the first and second surfaces will be the same for the eight substructures 110 as shown in FIG. 18.

Figure 19:
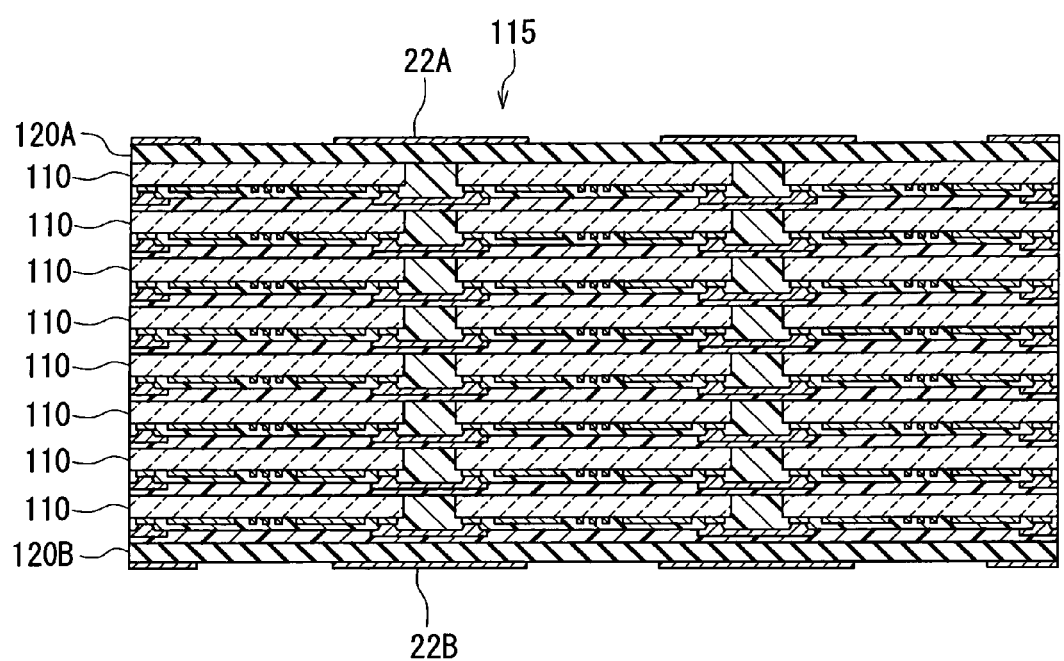
FIG. 19 is a cross-sectional view of a portion of a layered substructure fabricated in a step that follows the step of FIG. 18.
Figure 20:
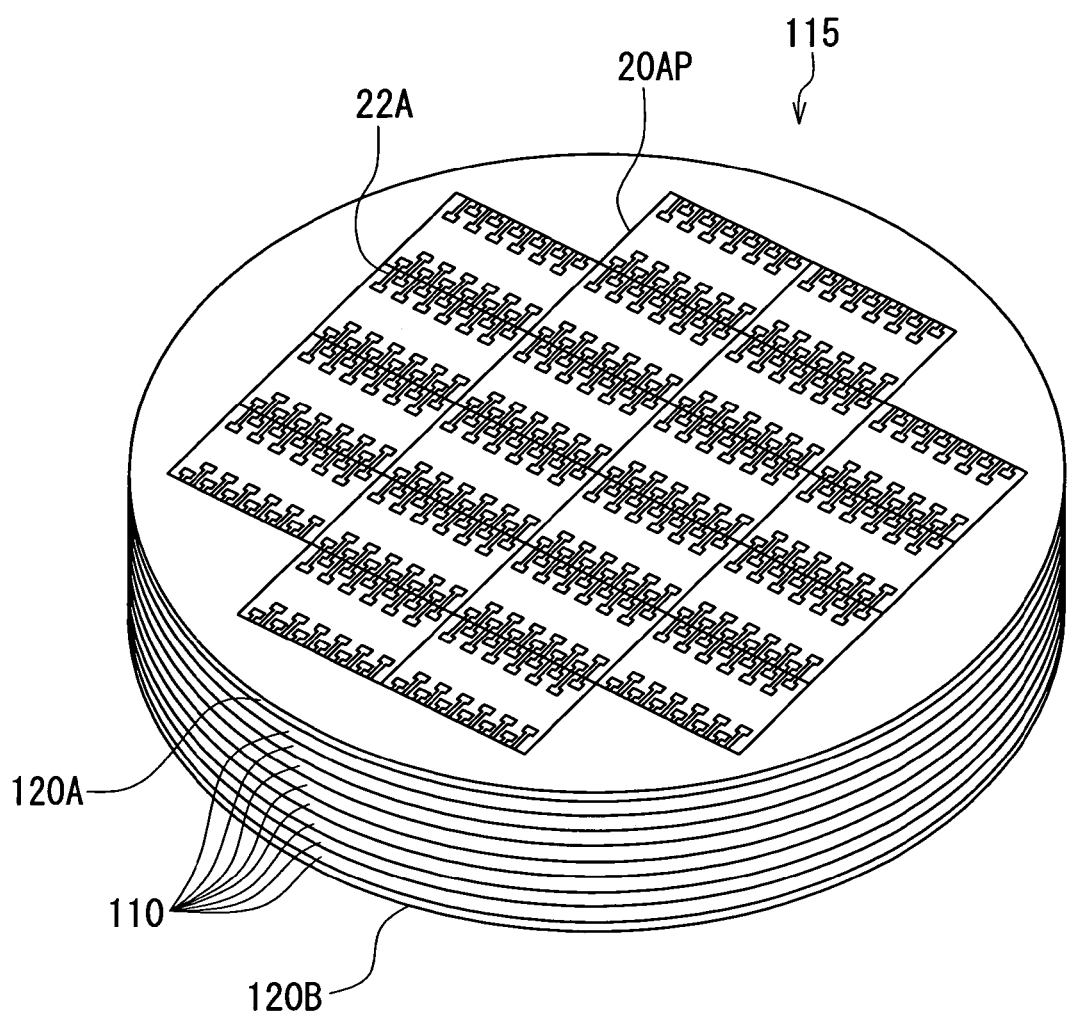
FIG. 20 is a perspective view of the layered substructure fabricated in the step that follows the step of FIG. 18.

FIG. 19 and FIG. 20 show a step that follows the step of FIG. 18. In this step, a layered substructure 115 is fabricated by bonding a terminal wafer 120A and a terminal wafer 120B respectively to the top surface and the bottom surface of the stack including the eight substructures 110 fabricated in the step of FIG. 18. The top surface and the bottom surface of the stack correspond to both end faces of the stack that are opposed to each other in the direction in which the substructures 110 are stacked. The terminal wafers 120A and 120B are each plate-shaped and formed of an insulating material such as a resin or ceramic. A plurality of groups of first terminals 22A corresponding to a plurality of layered chip packages 1 are disposed on the top surface of the terminal wafer 120A. The terminal wafer 120A is bonded to the top surface of the stack including the eight substructures 110. A plurality of groups of second terminals 22B corresponding to the plurality of layered chip packages 1 are disposed on the bottom surface of the terminal wafer 120B. The terminal wafer 120B is bonded to the bottom surface of the stack including the eight substructures 110.

As shown in FIG. 20, the terminal wafer 120A includes a plurality of pre-terminal-layer portions 20AP that will be separated from each other later to thereby become the terminal layers 20A. One each group of first terminals 22A is disposed in each pre-terminal-layer portion 20AP. FIG. 19 and FIG. 20 show an example in which, at the boundaries between every two adjacent pre-terminal-layer portions 20AP, first terminals 22A disposed in one of the two adjacent pre-terminal-layer portions 20AP are coupled to those disposed in the other of the two adjacent pre-terminal-layer portions 20AP. However, it is not necessarily required that first terminals 22A disposed in one of two adjacent pre-terminal-layer portions 20AP be coupled to those disposed in the other of the two adjacent pre-terminal-layer portions 20AP. Although not shown, the terminal wafer 120B similarly includes a plurality of pre-terminal-layer portions that will be separated from each other later to thereby become the terminal layers 20B, and one each group of second terminals 22B is disposed in each of the pre-terminal-layer portions.

The terminal wafers 120A and 120B may be transparent. In this case, alignment marks may be provided on at least one of the top surface of the terminal wafer 120A and the bottom surface of the terminal wafer 120B at the positions of the boundaries between every two adjacent pre-terminal-layer portions.

In the present embodiment, the layered substructure 115 is fabricated by stacking the plurality of substructures 110 into a stack and providing the plurality of groups of first terminals 22A and the plurality of groups of second terminals 22B on the stack, wherein the plurality of substructures 110 are stacked in correspondence with the order of stacking of the plurality of layer portions 10 of the layered chip package 1. In the example shown in FIG. 19 and FIG. 20, the plurality of groups of first terminals 22A and the plurality of groups of second terminals 22B are provided respectively on the top surface and the bottom surface of the stack including eight substructures 110, using the terminal wafers 120A and 120B. However, the plurality of groups of first terminals 22A and the plurality of groups of second terminals 22B may be provided respectively on the top surface and the bottom surface of the stack including eight substructures 110, without using the terminal wafers 120A and 120B. For example, an insulating film may be formed on the top surface of the stack including the eight substructures 110 shown in FIG. 19, and the plurality of groups of first terminals 22A may be formed on this insulating film by, for example, plating. Since the bottom surface of the stack including the eight substructures 110 shown in FIG. 19 is formed of the insulating layer 113, the plurality of groups of second terminals 22B may be formed on this bottom surface of the stack by, for example, plating.

In the present embodiment, the step of fabricating the layered substructure 115 includes, for example, the step of fabricating the first pre-substructure wafer 101, the step of fabricating the second pre-substructure wafer 101, the step of fabricating the first pre-polishing substructure 109 by using the first pre-substructure wafer 101, the step of fabricating the second pre-polishing substructure 109 by using the second pre-substructure wafer 101, the step of bonding the first pre-polishing substructure 109 to the jig 112, the first polishing step for polishing the second surface 109b of the first pre-polishing substructure 109 so as to form the first substructure 110; the step of bonding the second pre-polishing substructure 109 to the first substructure 110; and the second polishing step for polishing the second surface 109b of the second pre-polishing substructure 109 so as to form the second substructure 110.

If each pre-polishing substructure 109 is polished alone into the substructure 110, the substructure 110 becomes difficult to handle and also becomes susceptible to damage, as the substructure 110 is made thin to a thickness of, for example, 30 to 100 µm. In addition, because of a difference in thermal expansion coefficient between the semiconductor chip 30 and the insulating layer 106 in the substructure 110, the substructure 110 will become curved as it becomes thin. This also makes it difficult to handle the substructure 110 and makes the substructure 110 susceptible to damage.

According to the present embodiment, the first pre-polishing substructure 109 is polished in the state of being bonded to the jig 112. This facilitates handling of the first substructure 110 formed by thinning the first pre-polishing substructure 109 by the polishing, and makes the first substructure 110 resistant to damage. In addition, the second pre-polishing substructure 109 is polished in the state of being bonded to the first substructure 110 bonded to the jig 112. This facilitates handling of the second substructure 110 formed by thinning the second pre-polishing substructure 109 by the polishing, and makes the second substructure 110 resistant to damage. The same holds true for one or more additional substructures 110 to be stacked on the second substructure 110.

In the present embodiment, the method of fabricating the layered substructure 115 is not limited to the method described with reference to FIG. 4 to FIG. 20. For example, the layered substructure 115 can be fabricated through: bonding two pre-polishing substructures 109 to each other such that the respective first surfaces 109a face toward each other; polishing the respective second surfaces 109b of the two pre-polishing substructures 109 to thereby form a stack including two substructures 110; and stacking a plurality of such stacks. Alternatively, the layered substructure 115 can be fabricated through: bonding two substructures 110 to each other such that the respective second surfaces 110b face toward each other to thereby form a stack of the two substructures 110; and stacking a plurality of such stacks.

Figure 21:
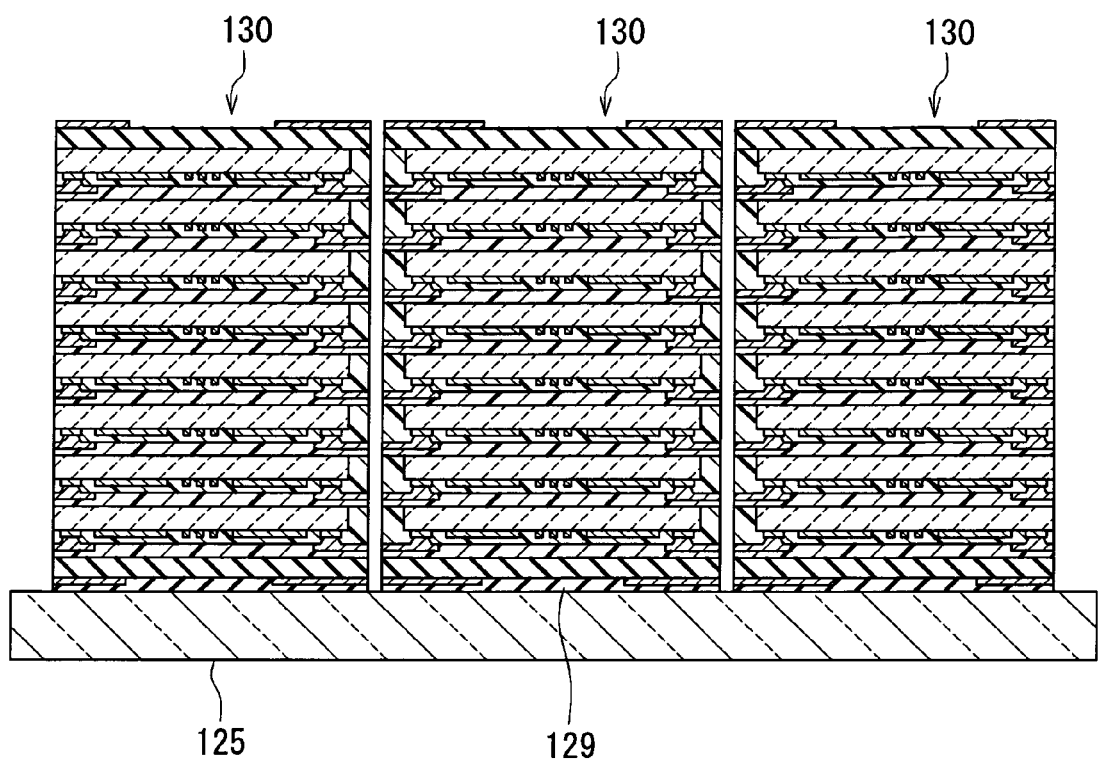
FIG. 21 is a cross-sectional view of a portion of a main body aggregate fabricated in a step that follows the step of FIG. 19.
Figure 22:
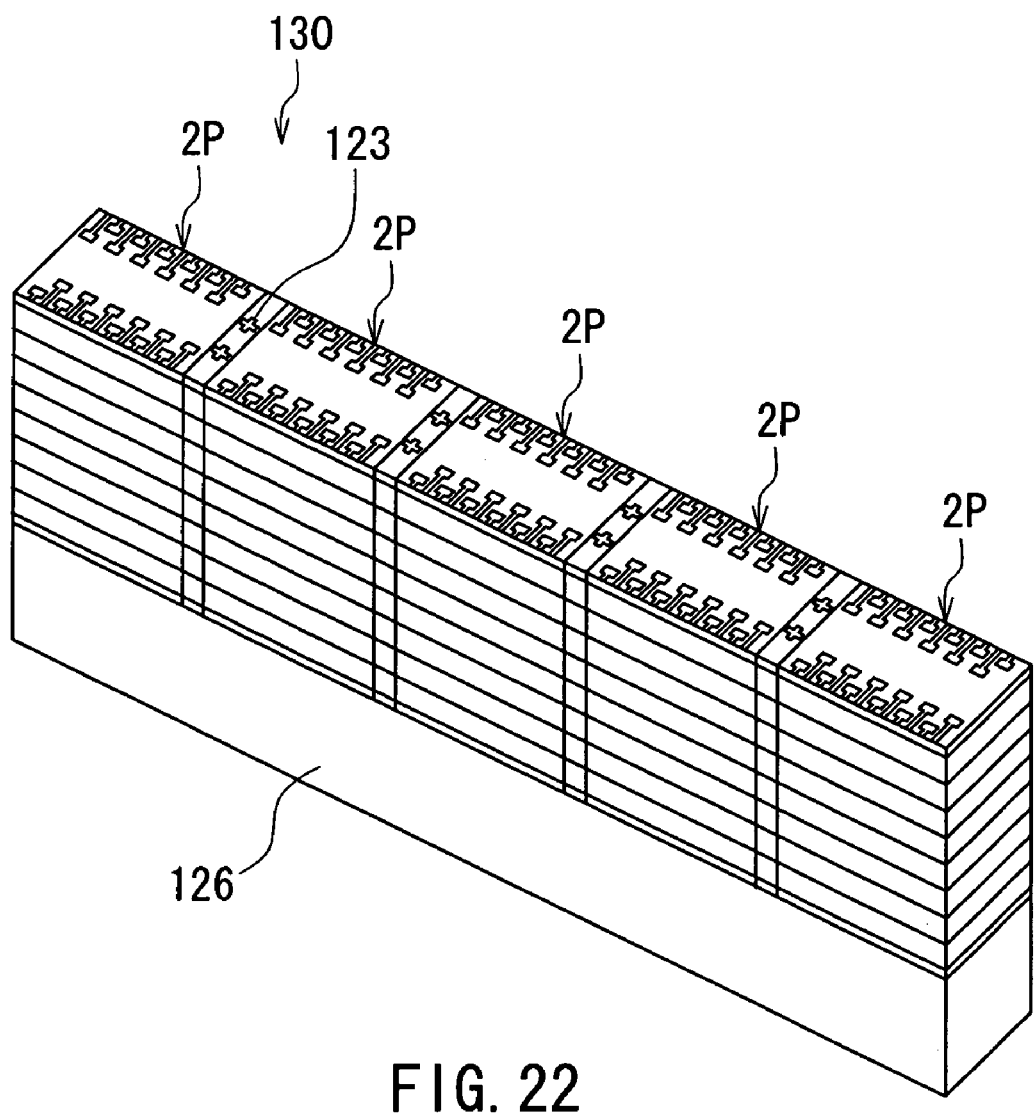
FIG. 22 is a perspective view of an example of the main body aggregate fabricated in the step of FIG. 21.
Figure 23:
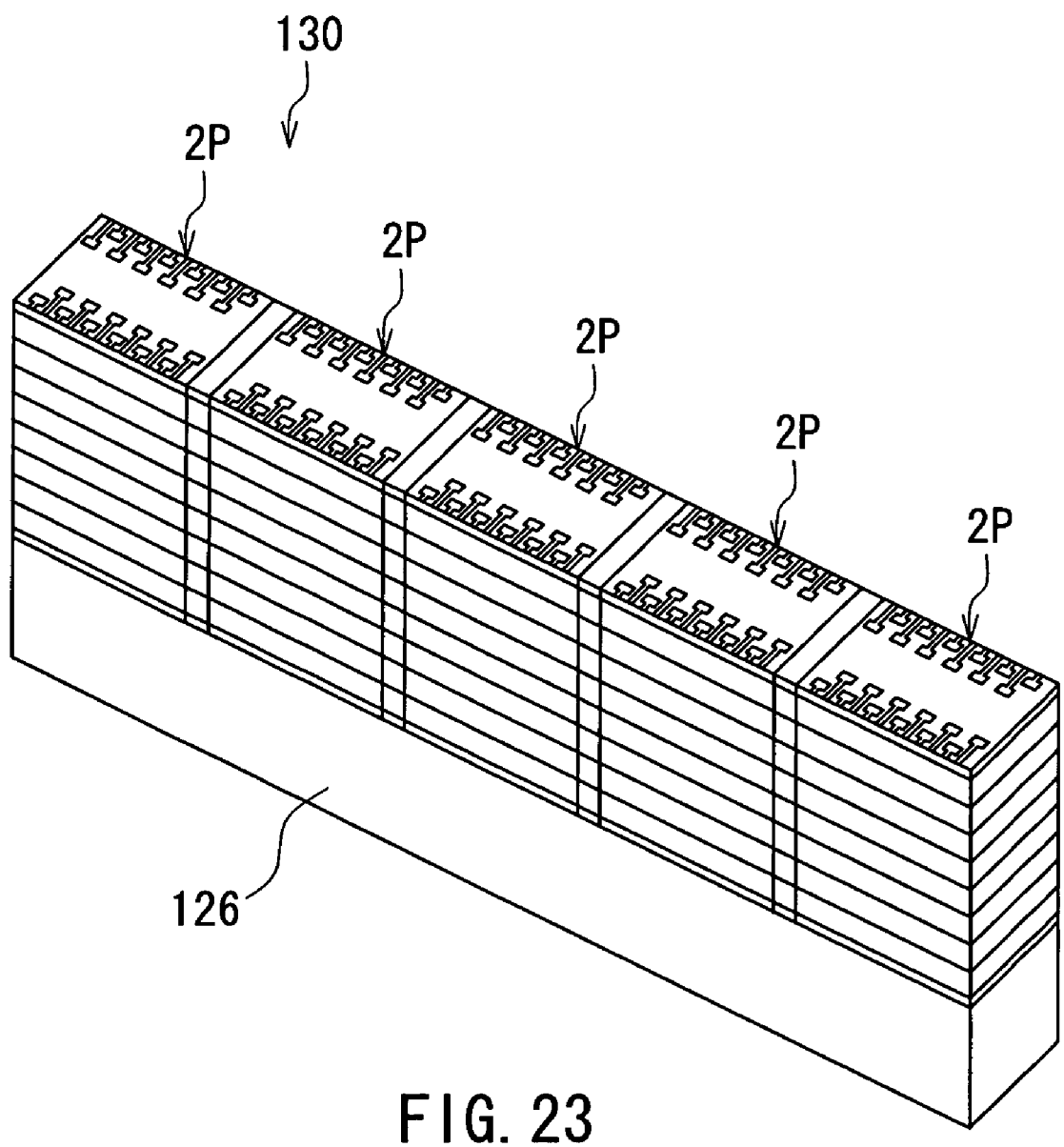
FIG. 23 is a perspective view of another example of the main body aggregate fabricated in the step of FIG. 21.

A description will now be made on the step of fabricating a plurality of layered chip packages 1 by using the layered substructure 115. In this step, first, as shown in FIG. 21, the layered substructure 115 is cut with a dicing saw along the first grooves 104A of FIG. 17 to provide a plurality of main body aggregates 130. FIG. 22 shows an example of each main body aggregate 130. FIG. 23 shows another example of each main body aggregate 130. As shown in FIG. 22 and FIG. 23, each main body aggregate 130 includes a plurality of pre-main-body portions 2P that are aligned in one direction that is orthogonal to the stacking direction of the plurality of layer portions 10 of the layered chip package 1. Each of the pre-main-body portions 2P will become the main body 2 later. The main body aggregate 130 shown in FIG. 22 is obtained by cutting the layered substructure 115 in which the terminal wafers 120A and 120B are transparent and alignment marks 123 are provided on at least one of the top surface of the terminal wafer 120A and the bottom surface of the terminal wafer 120B at the positions of the boundaries between every adjacent two of the pre-terminal-layer portions. The main body aggregate 130 shown in FIG. 23 is obtained by cutting the layered substructure 115 in which the alignment marks 123 are provided on neither the top surface of the terminal wafer 120A nor the bottom surface of the terminal wafer 120B. While FIG. 22 and FIG. 23 show that the main body aggregate 130 includes five pre-main-body portions 2P, the main body aggregate 130 can include any plural number of pre-main-body portions 2P.

The layered substructure 115 may be cut in the state of being bonded to a plate-shaped jig or to a wafer sheet that is typically used for dicing a wafer. FIG. 21 shows the example in which the layered substructure 115 has been cut in the state of being bonded to a plate-shaped jig 125. While FIG. 21 shows that the jig 125 is not cut, the jig 125 may be cut together with the layered substructure 115.

As shown in FIG. 22 and FIG. 23, the main body aggregate 130 has a top surface, a bottom surface and four side surfaces. A jig 126 may be bonded to the bottom surface of the main body aggregate 130. The jig 126 may be one obtained by cutting the jig 125 bonded to the layered substructure 115 when cutting the layered substructure 115.

Figure 24:
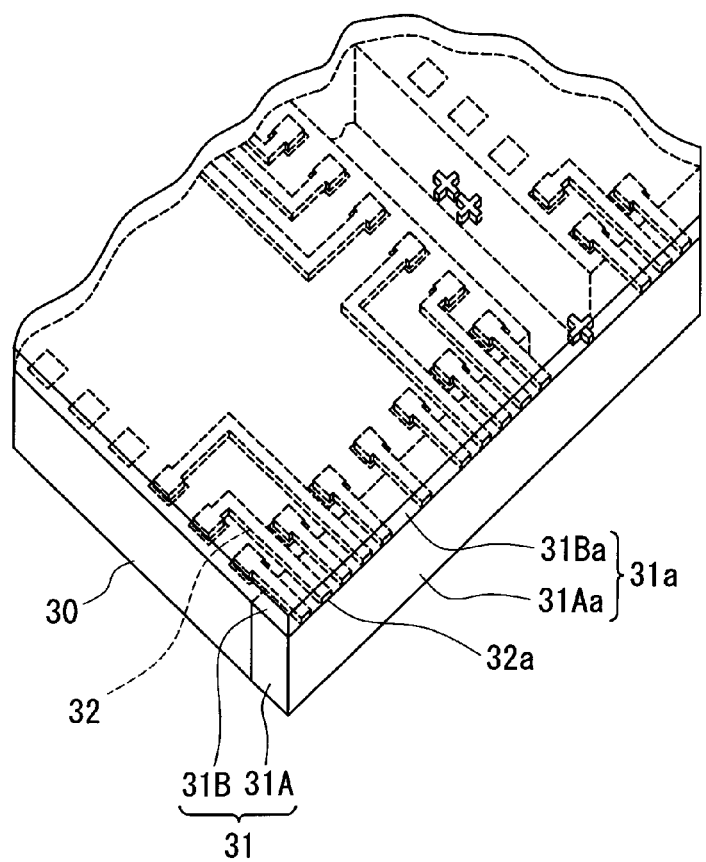
FIG. 24 is a perspective view of a portion of the main body aggregate fabricated in the step of FIG. 21.

In the step of cutting the layered substructure 115, the insulating layer 106 is cut such that a cut surface is formed along the direction in which the first groove 104A of FIG. 17 extends. FIG. 24 shows part of the main body aggregate 130 formed by cutting the layered substructure 115. As shown in FIG. 24, the insulating layer 106 becomes an insulating layer 31A by being cut. The insulating layer 31A is part of the insulating portion 31. In addition, part of the end face 31a of the insulating portion 31 is formed by the cut surface of the insulating layer 106, that is, a cut surface 31Aa of the insulating layer 31A.

In the step of cutting the layered substructure 115, the insulating layer 113 covering the electrodes 32 is also cut when the insulating layer 106 is cut. By being cut, the insulating layer 113 becomes an insulating layer 31B that is another part of the insulating portion 31. In addition, another part of the end face 31a of the insulating portion 31 is formed by the cut surface of the insulating layer 113, that is, a cut surface 31Ba of the insulating layer 31B.

In the step of cutting the layered substructure 115, by cutting the insulating layer 106, the end faces 32a of the plurality of electrodes 32 are exposed from the end face 31a of the insulating portion 31. The end faces 32a are surrounded by the insulating portion 31.

By cutting the layered substructure 115, the end faces 32a of the plurality of electrodes 32 appear at two of the four side surfaces of the main body aggregate 130, the two of the four side surfaces each being parallel to the direction in which the plurality of pre-main-body portions 2P are aligned. To be more specific, the end faces 32Aa of the plurality of electrodes 32A of all the layer portions 10 included in the main body aggregate 130 appear at one of the above two side surfaces of the main body aggregate 130, whereas the end faces 32Ba of the plurality of electrodes 32B of all the layer portions 10 included in the main body aggregate 130 appear at the other of the two side surfaces of the main body aggregate 130 that is opposite to the one mentioned above.

In the step of fabricating the plurality of layered chip packages 1, after cutting the layered substructure 115, polishing is performed on the two side surfaces of the main body aggregate 130 at which the end faces 32a of the electrodes 32 appear. Next, the wiring 3A, 3B is formed for each of the pre-main-body portions 2P of the main body aggregate 130. In the step of forming the wiring 3A, 3B, a plurality of main body aggregates 130 may be arranged in the stacking direction of the plurality of layer portions 10 and then the wiring 3A, 3B may be formed for each of the pre-main-body portions 2P of the plurality of main body aggregates 130 simultaneously. It is thereby possible to form the wiring 3A, 3B for a large number of pre-main-body portions 2P in a short time.

Figure 25:
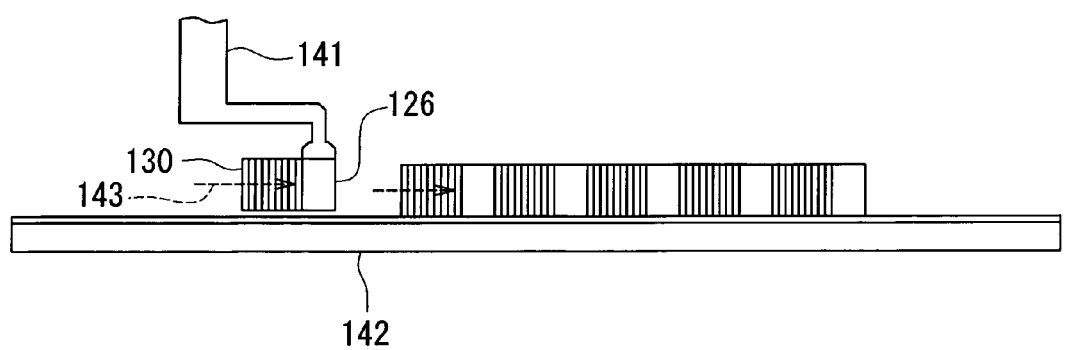
FIG. 25 is an illustrative view showing an example of a method of arranging a plurality of main body aggregates in the manufacturing method for the layered chip package of the first embodiment of the invention.
Figure 26:
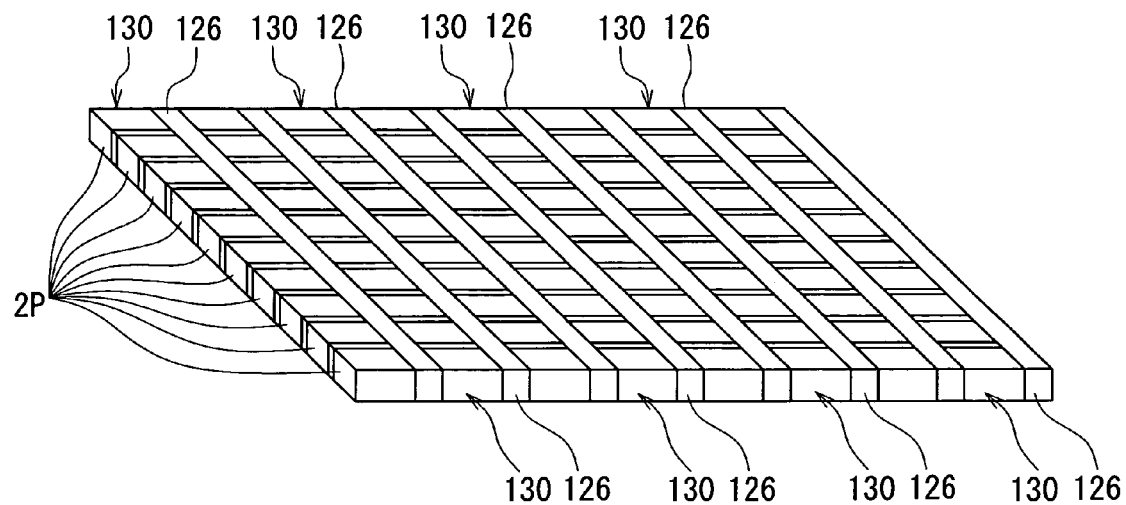
FIG. 26 is a perspective view showing a state in which a plurality of main body aggregates are arranged with a jig bonded to each of the main body aggregates.

FIG. 25 shows an example of a method of arranging a plurality of main body aggregates 130. In this example, a plurality of main body aggregates 130 each of which has the jig 126 bonded thereto are arranged on a table 142, while performing alignment, in the stacking direction of the plurality of layer portions 10 by using a chip bonding apparatus capable of recognizing and controlling the position of a chip. Reference numeral 141 in FIG. 25 indicates a head for holding a chip. In this example, a main body aggregate 130 with the jig 126 bonded thereto is held by the head 141 and placed to a desired position on the table 142 while recognizing and controlling the position of the main body aggregate 130. FIG. 26 shows a state in which a plurality of main body aggregates 130 each of which has the jig 126 bonded thereto are arranged in the stacking direction of the plurality of layer portions 10. The plurality of main body aggregates 130 thus arranged may be fixed by being bonded to each other such that they are easily separable.

When arranging the plurality of main body aggregates 130, the position of the edge of each main body aggregate 130 and/or the positions of the end faces 32a of the electrodes 32 that appear at the side surfaces of each main body aggregate 130 may be recognized with an image recognizer included in the chip bonding apparatus. It is thereby possible to recognize and control the position of each main body aggregate 130.

Figure 27:
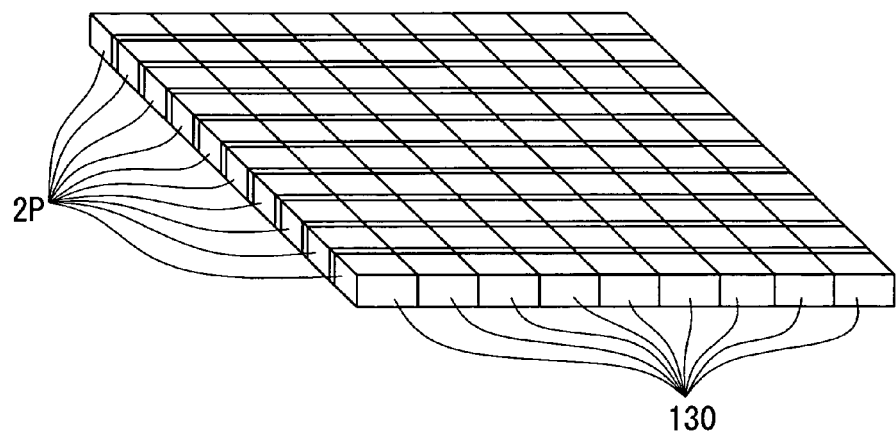
FIG. 27 is a perspective view showing a state in which a plurality of main body aggregates are arranged without any jig bonded to each of the main body aggregates.

Alternatively, a plurality of main body aggregates 130 each of which is without the jig 126 bonded thereto may be arranged in the stacking direction of the plurality of layer portions 10 while performing alignment. FIG. 27 shows the plurality of main body aggregates 130 arranged in such a manner. In this case, too, the plurality of main body aggregates 130 thus arranged may be fixed by being bonded to each other such that they are easily separable.

In the case of arranging a plurality of main body aggregates 130 each of which is without the jig 126 bonded thereto, if the portions to become the insulating portion 31 and the terminal layers 20A and 20B are transparent and consequently at least either the alignment marks 107 or 123 are observable, the position of each main body aggregate 130 may be recognized and controlled by recognizing at least either the alignment marks 107 or 123 through the use of the image recognizer included in the chip bonding apparatus. In this case, the alignment marks are observed in the direction of the arrow 143 in FIG. 25.

Figure 28:
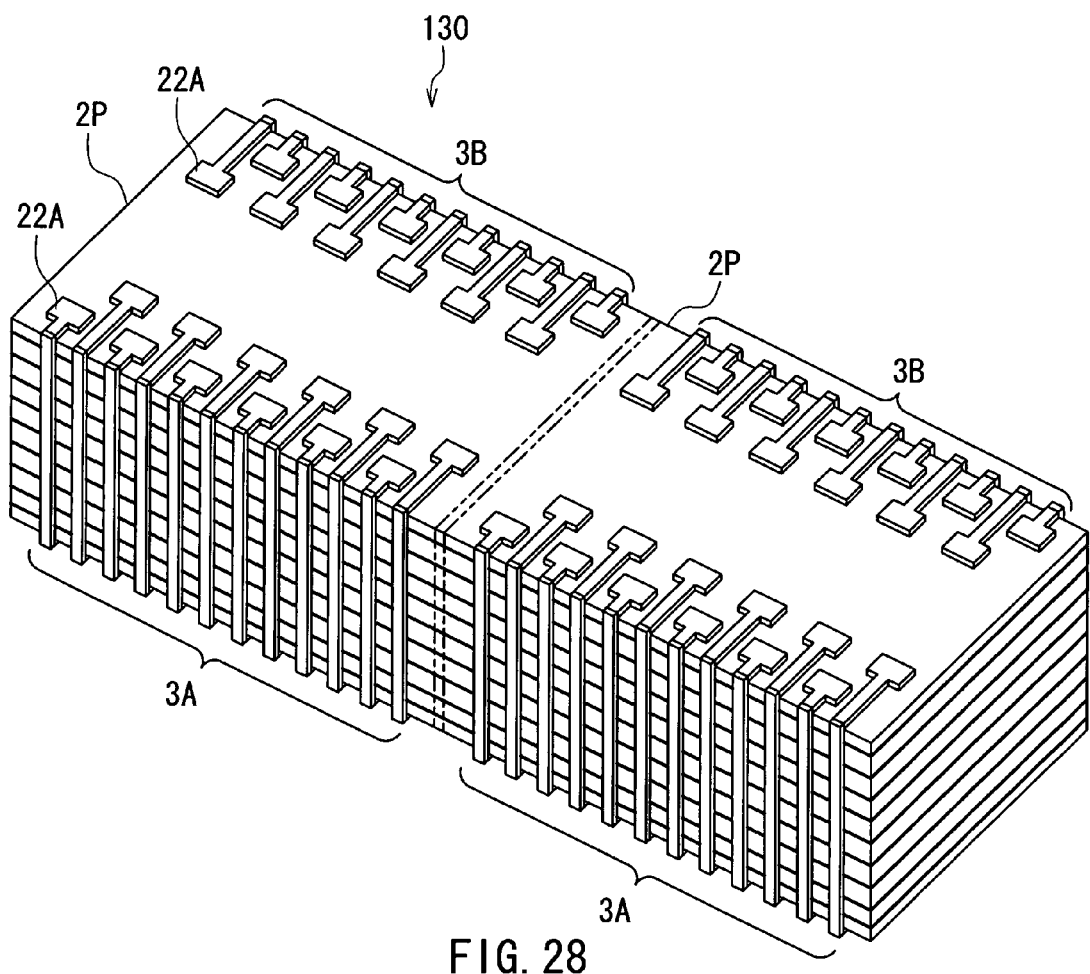
FIG. 28 is a perspective view of a portion of the main body aggregate having undergone the formation of wiring.

Reference is now made to FIG. 28 to describe the step of forming the wiring 3A, 3B. In this step, the wiring 3A, 3B is formed for each of the pre-main-body portions 2P of the main body aggregate 130. The wiring 3A, 3B is formed by frame plating, for example. In this case, first, a seed layer for plating is formed on the side surface of the main body aggregate 130 on which the wiring 3A is to be formed. Next, a frame having grooves is formed on the seed layer. The frame is formed by patterning a photoresist film by photolithography, for example. Next, plating layers to become part of the wiring 3A is formed by plating on the seed layer in the grooves of the frame. Next, the frame is removed and the seed layer except portions thereof located below the plating layers is removed by etching. As a result, the wiring 3A is formed of the plating layers and the portions of the seed layer remaining therebelow. Next, the wiring 3B is formed in the same way as the wiring 3A on the side surface of the main body aggregate 130 on which the wiring 3B is to be formed. FIG. 28 shows a portion of the main body aggregate 130 having undergone the formation of the wiring 3A, 3B.

Figure 29:
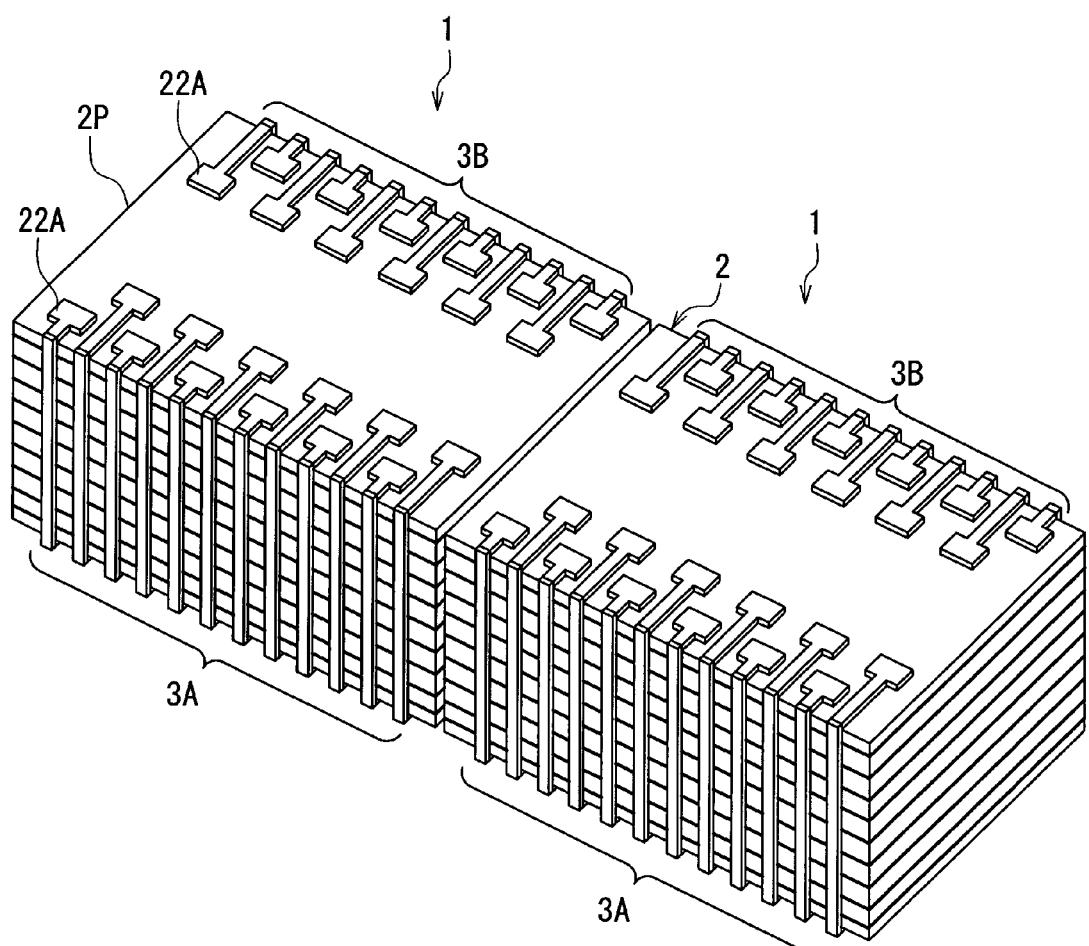
FIG. 29 is a perspective view showing a plurality of layered chip packages formed by cutting the main body aggregate.

Reference is now made to FIG. 29 to describe the step of cutting the main body aggregate 130. In this step, the main body aggregate 130 is cut to separate the plurality of pre-main-body portions 2P included in the main body aggregate 130 from each other so that each of the pre-main-body portions 2P becomes the main body 2 and a plurality of layered chip packages 1 are thereby formed. In this way, as shown in FIG. 29, a plurality of layered chip packages 1 are manufactured at the same time.

The layered chip package 1 of the present embodiment can be used as it is as a single electronic component. For example, the layered chip package 1 can be mounted on a wiring board by a flip-chip technique such that the first terminals 22A or the second terminals 22B are connected to a conductor layer on the wiring board.

For example, if a device for use with the layered chip package 1 has a recessed portion to accommodate the layered chip package 1, the layered chip package 1 can be inserted to the recessed portion to connect the first terminals 22A or the second terminals 22B to circuits in the device.

The first terminals 22A or the second terminals 22B of the layered chip package 1 may also be connected to a plurality of terminals of a device for use with the layered chip package 1 through a plurality of bonding wires.

Figure 30:
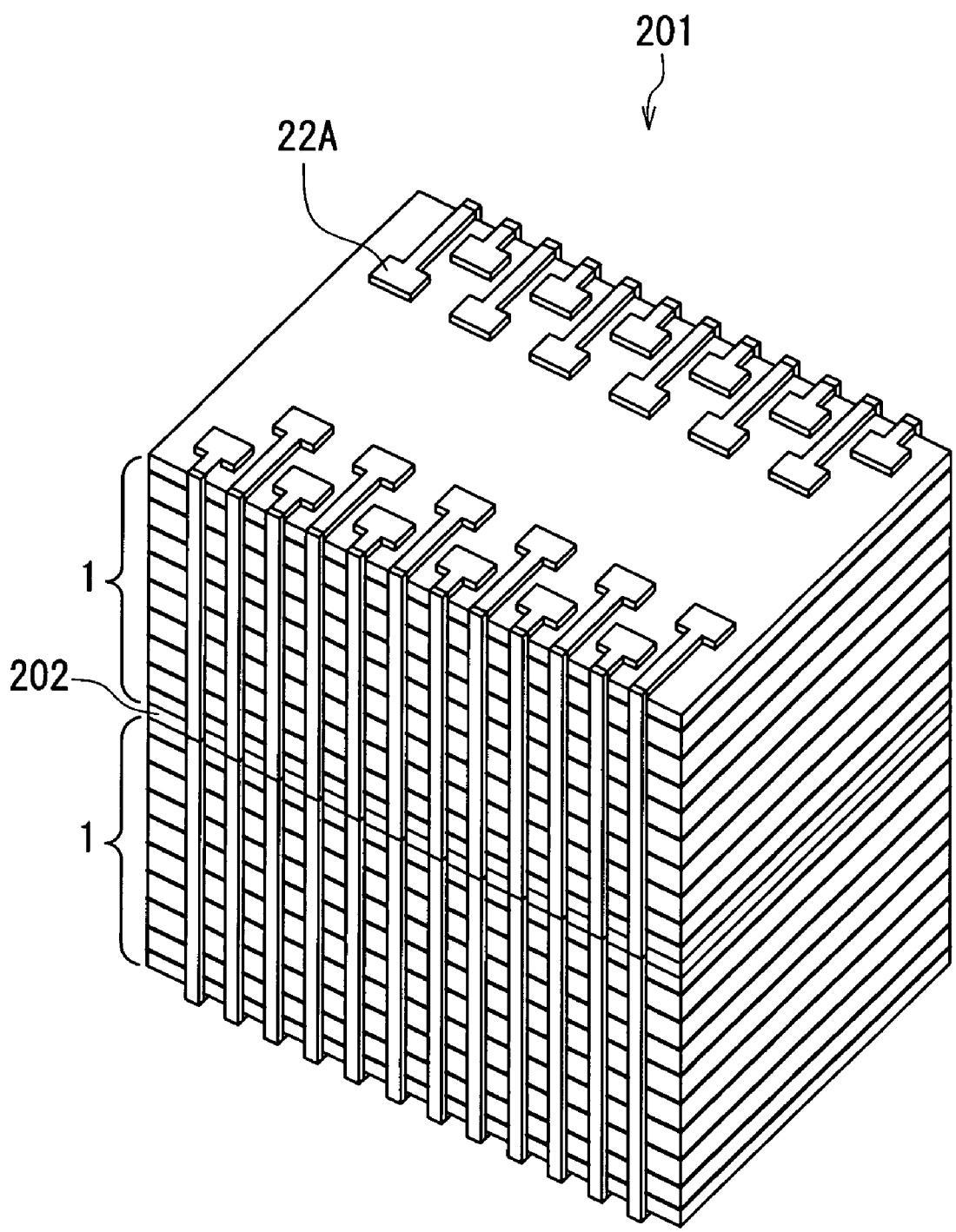
FIG. 30 is a perspective view showing a first example of using a plurality of layered chip packages.

Reference is now made to FIG. 30 to FIG. 41 to describe some examples of using a plurality of layered chip packages 1. FIG. 30 shows a first example of using a plurality of layered chip packages 1. This is an example in which a plurality of layered chip packages 1 are stacked and every vertically adjacent two of the layered chip packages 1 are electrically connected to each other to form an electronic component 201. While FIG. 30 shows that the electronic component 201 is composed of a stack of two layered chip packages 1, three or more layered chip packages 1 may be stacked to constitute an electronic component 201. In the two vertically adjacent layered chip packages 1 of this electronic component 201, the first terminals 22A of the lower one of the layered chip packages 1 are electrically connected to the second terminals 22B of the upper one of the layered chip packages 1. The two vertically adjacent layered chip packages 1 are bonded to each other with an insulating adhesive 202, for example.

The first example makes it possible that, if any of the plurality of layered chip packages 1 constituting the electronic component 201 includes a defective semiconductor chip 30, the layered chip package 1 including the defective semiconductor chip 30 can be replaced with a new one to rework the electronic component 201 into a non-defective one. The rework of the electronic component 201 is easier than a rework of a layered chip package 1 including the same number of layer portions 10 as those included in the electronic component 201. Thus, the first example has the advantage of facilitating the rework of the electronic component 201 including a plurality of layer portions 10.

Figure 31:
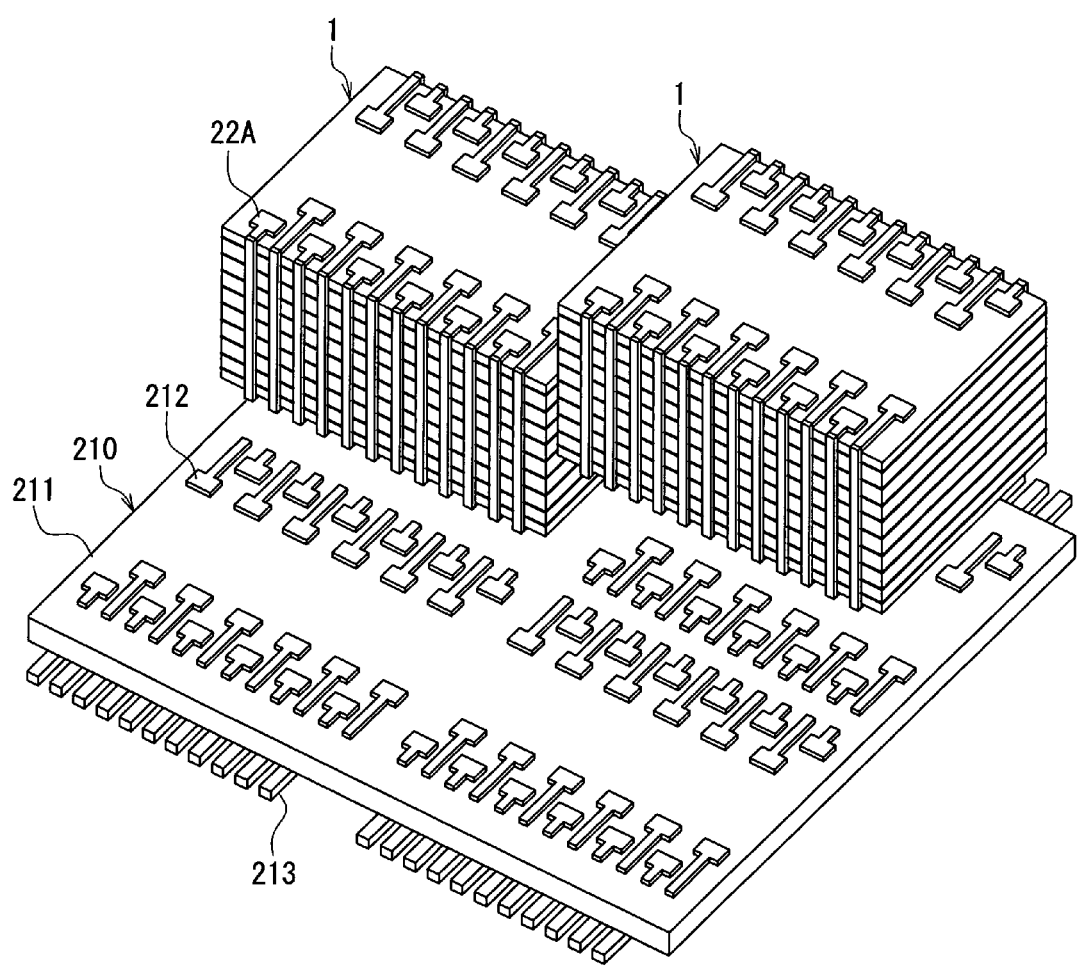
FIG. 31 is a perspective view showing a second example of using a plurality of layered chip packages.
Figure 32:
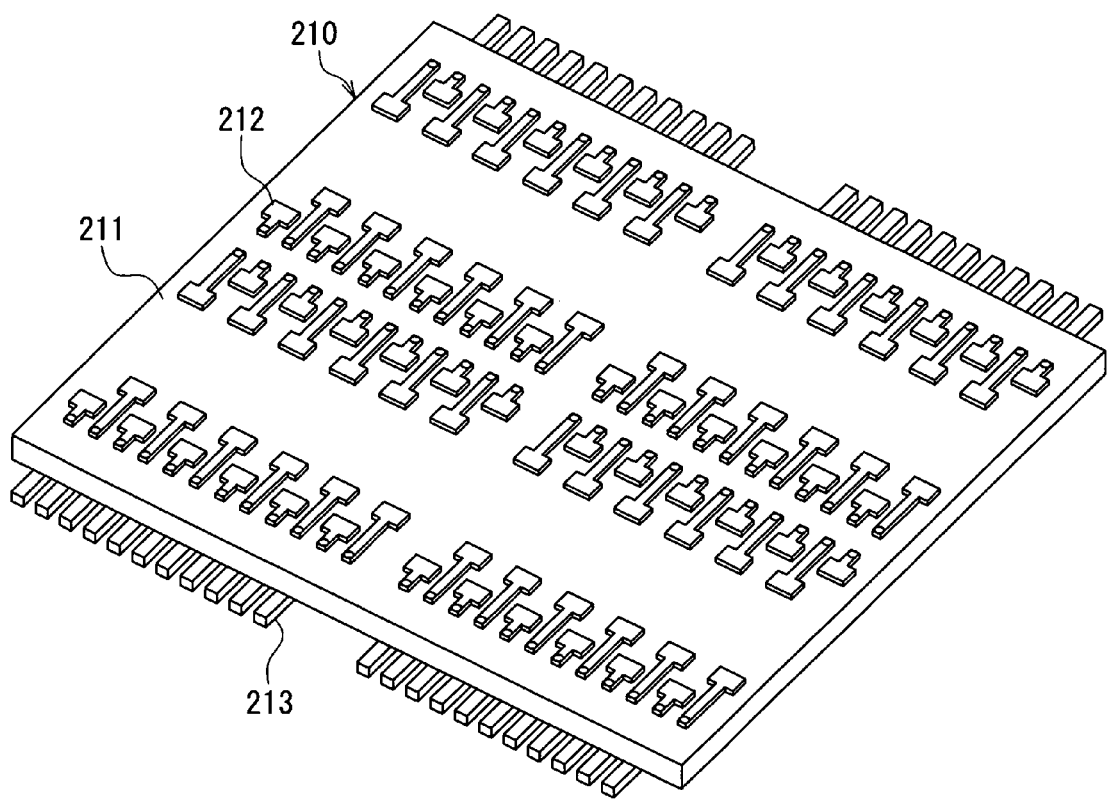
FIG. 32 is a perspective view of the wiring board shown in FIG. 31.
Figure 33:
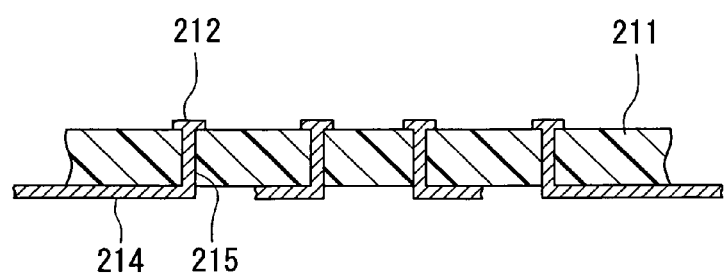
FIG. 33 is a cross-sectional view of the wiring board shown in FIG. 31.

FIG. 31 shows a second example of using a plurality of layered chip packages 1. In this example, a plurality of layered chip packages 1 are mounted on a wiring board 210 to form a module. FIG. 32 is a perspective view of the wiring board 210. FIG. 33 is a cross-sectional view of the wiring board 210. As shown in FIG. 32, the wiring board 210 includes a board main body 211 made of an insulating material such as a resin, and a plurality of groups of pad-shaped electrodes 212 disposed on the top surface of the board main body 211. Each group of electrodes 212 are designed to allow connection of the second terminals 22B of a single layered chip package 1 thereonto. The wiring board 210 further includes: a plurality of external connecting terminals 213 disposed on the bottom surface of the board main body 211 and protruding horizontally outward; wiring 214 disposed on the bottom surface of the board main body 211 and connected to the external connecting terminals 213; and a plurality of connecting portions 215 penetrating through the board main body 211 and electrically connecting the electrodes 212 to the wiring 214. According to the second example shown in FIG. 31, it is possible to provide a single module including a plurality of layered chip packages 1.

Figure 34:
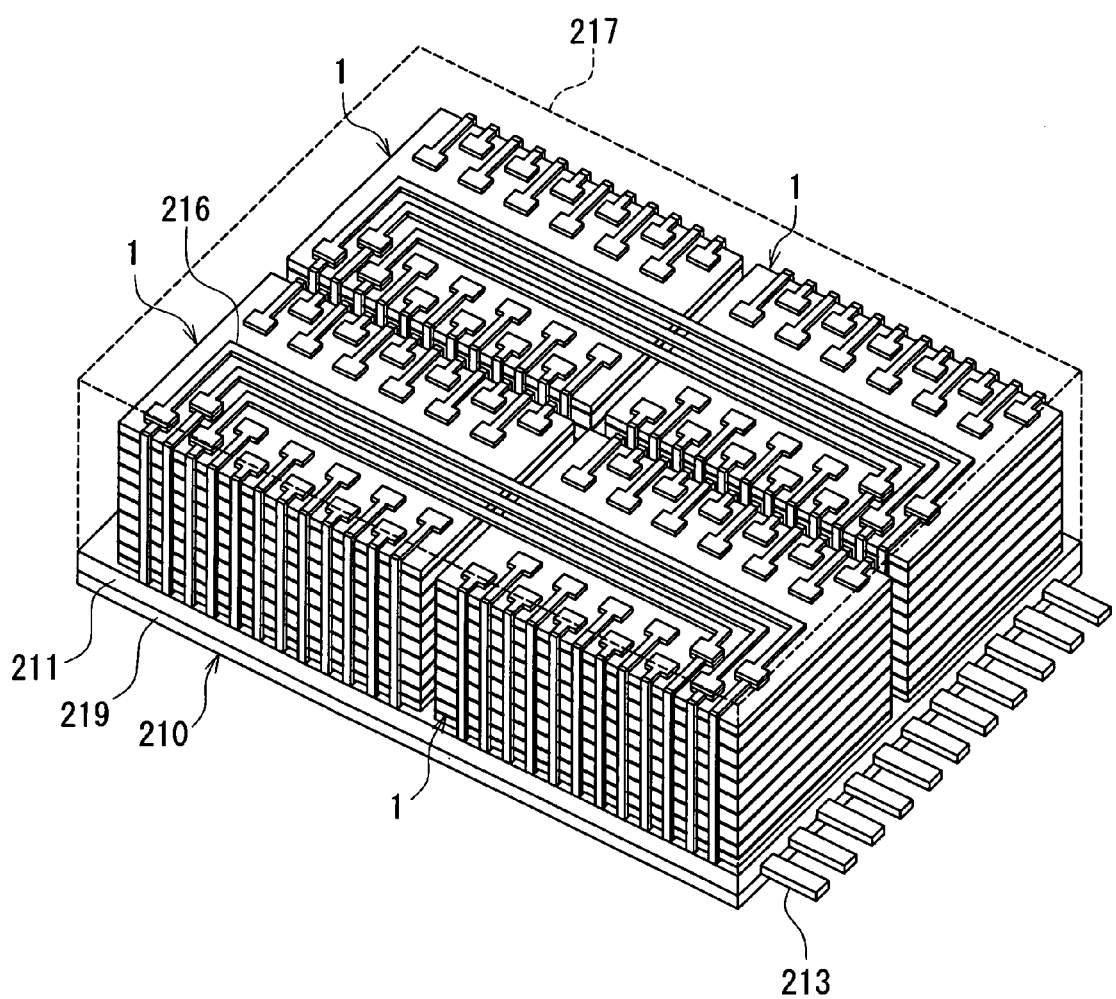
FIG. 34 is a perspective view showing a third example of using a plurality of layered chip packages.

FIG. 34 shows a third example of using a plurality of layered chip packages 1. In this example, a module is formed by mounting a plurality of layered chip packages 1 on a wiring board 210 as in the second example shown in FIG. 31, and providing wiring 216 for electrically connecting the first terminals 22A of the plurality of layered chip packages 1 to each other. In this example, a resin layer is formed in a space between every two horizontally adjacent layered chip packages 1 by filling the space with an insulating resin. The wiring 216 is formed on the top surfaces 2a of the main bodies 2 of the plurality of layered chip packages 1 and on the top surface of the resin layer. The wiring 216 is formed by plating, for example. The plurality of layered chip packages 1 and the wiring 216 are sealed with a molded resin 217.

According to the third example shown in FIG. 34, it is possible to provide a module including a plurality of layered chip packages 1 wherein the second terminals 22B of the plurality of layered chip packages 1 are electrically connected to each other by the wiring board 210 while the first terminals 22A of the plurality of layered chip packages 1 are electrically connected to each other by the wiring 216. According to the third example, it is possible to establish electrical connection between the plurality of layered chip packages 1 not only through the wiring board 210 but also through the wiring 216. Consequently, the third example makes it possible to prevent the wiring for establishing electrical connection between the plurality of layered chip packages 1 from occupying a too large area in the wiring board 210, and thereby allows miniaturization of the module.

Figure 35:
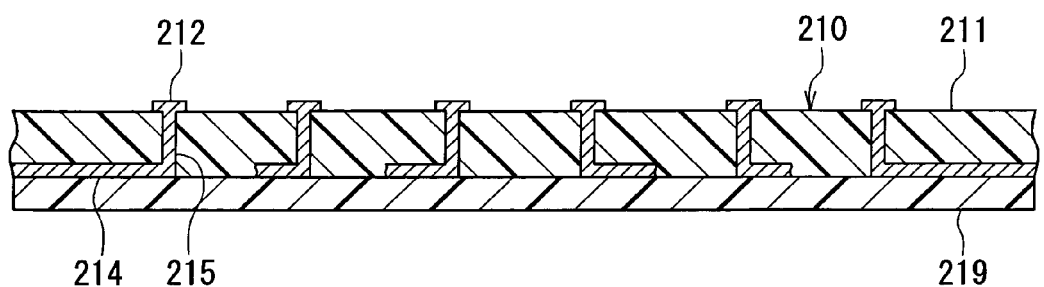
FIG. 35 is a cross-sectional view showing a step of a fabrication method for the module shown in FIG. 34.

A fabrication method for the module shown in FIG. 34 will now be described with reference to FIG. 35 to FIG. 38. In the fabrication method, first, the wiring board 210 shown in FIG. 35 is prepared. The wiring board 210 includes: a board main body 211 formed of an insulating material such as a resin; a plurality of groups of pad-shaped electrodes 212 disposed on the top surface of the board main body 211; a plurality of external connecting terminals 213 (see FIG. 34) disposed on the bottom surface of the board main body 211 and protruding horizontally outward; wiring 214 disposed on the bottom surface of the board main body 211 and connected to the external connecting terminals 213; a plurality of connecting portions 215 penetrating through the board main body 211 and electrically connecting the electrodes 212 to the wiring 214; and an insulating layer 219 formed of an insulating material such as a resin and covering the bottom surface of the board main body 211.

Figure 36:
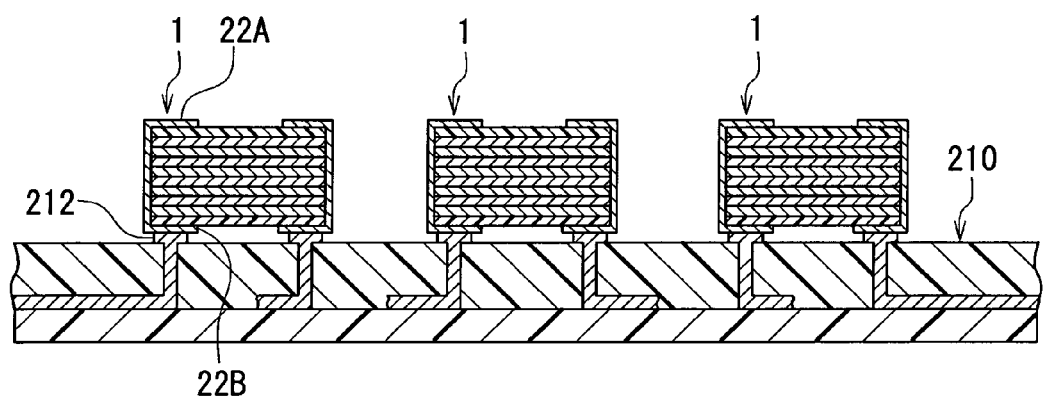
FIG. 36 is a cross-sectional view showing a step that follows the step of FIG. 35.

Next, as shown in FIG. 36, the plurality of layered chip packages 1 are mounted onto the wiring board 210 such that the second terminals 22B of the respective layered chip package 1 are connected to the electrodes 212 of the respective groups.

Figure 37:
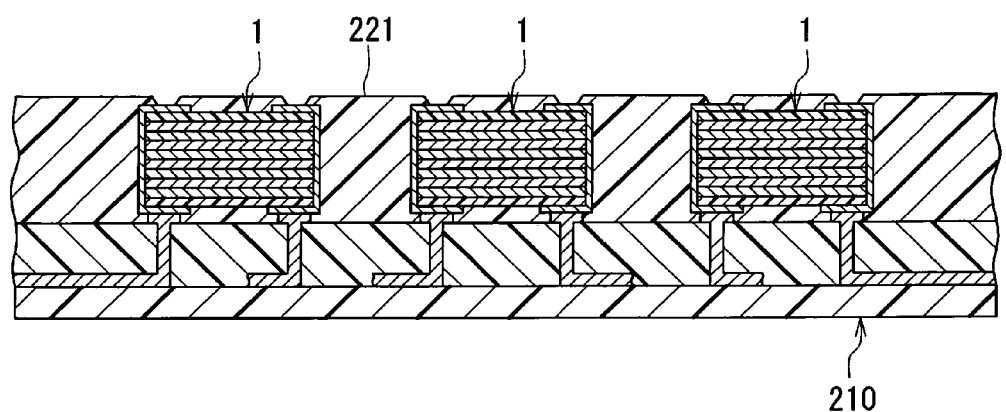
FIG. 37 is a cross-sectional view showing a step that follows the step of FIG. 36.

Next, as shown in FIG. 37, a resin layer 221 made of an insulating resin is formed to fill the space between every two horizontally adjacent layered chip packages 1 and to cover the plurality of layered chip packages 1. Next, openings are formed in the rein layer 221 so that the first terminals 22A are exposed for connection with the wiring 216.

Figure 38:
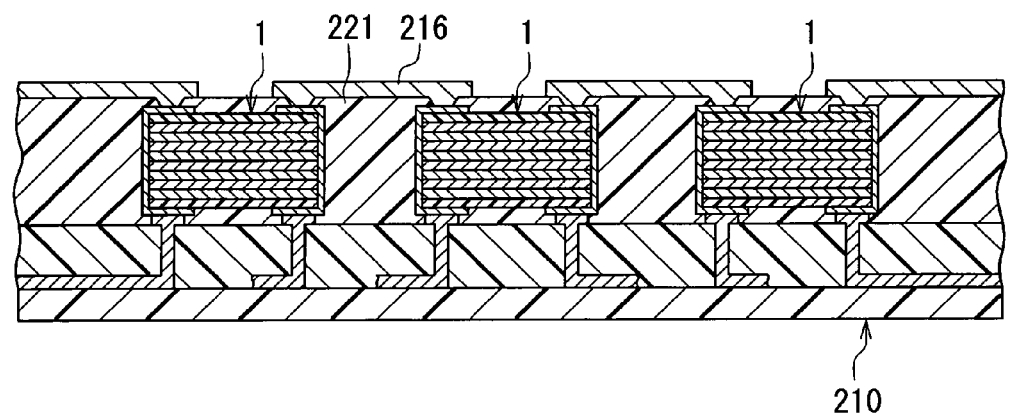
FIG. 38 is a cross-sectional view showing a step that follows the step of FIG. 37.

Next, as shown in FIG. 38, the wiring 216 is formed on the resin layer 221 by, for example, plating. Finally, as shown in FIG. 34, the plurality of layered chip packages 1 and the wiring 216 are sealed with the molded resin 217.

Figure 39:
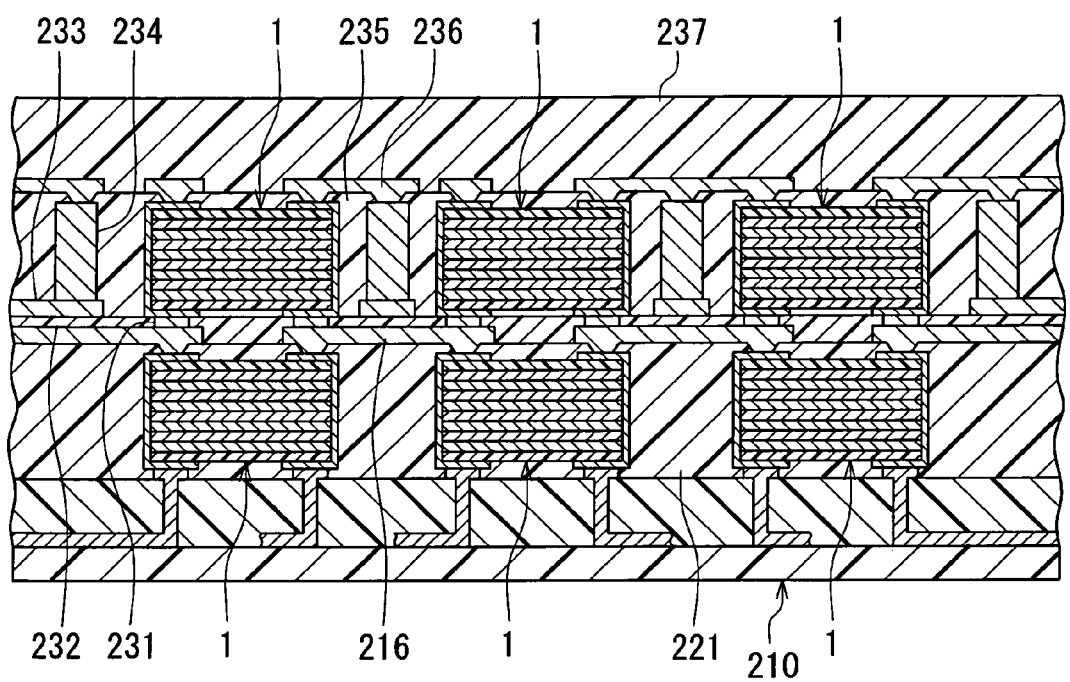
FIG. 39 is a cross-sectional view showing a fourth example of using a plurality of layered chip packages.

FIG. 39 shows a fourth example of using a plurality of layered chip packages 1. In this example, on the wiring board 210 a plurality of layered chip packages 1 are mounted as in the third example shown in FIG. 34, and another plurality of layered chip packages 1 are provided thereon to form a module.

The module of the fourth example further includes: wiring 233 formed on the insulating layer 232; the plurality of the layered chip packages 1 disposed on the insulating layer 232; and a plurality of connecting portions 234 made of a conductor and formed on the wiring 233. The second terminals 22B of the layered chip packages 1 disposed on the insulating layer 232 are connected to the connecting portions 231 and electrically connected to the wiring 216 through the connecting portions 231.

The module of the fourth example further includes: a resin layer 235 made of an insulating resin and covering the wiring 233, the connecting portions 234 and the layered chip packages 1 disposed on the insulating layer 232; wiring 236 formed on the resin layer 235; and a molded resin 237 covering the wiring 236. The resin layer 235 has a plurality of openings for exposing the first terminals 22A of the layered chip packages 1 and the connecting portions 234. The wiring 233 is connected to the first terminals 22A of the layered chip packages 1 and the connecting portions 234 through these openings.

According to the fourth example, it is possible to provide a module including a large number of layered chip packages 1 wherein electrical connection is established between the layered chip packages 1.

Figure 40:
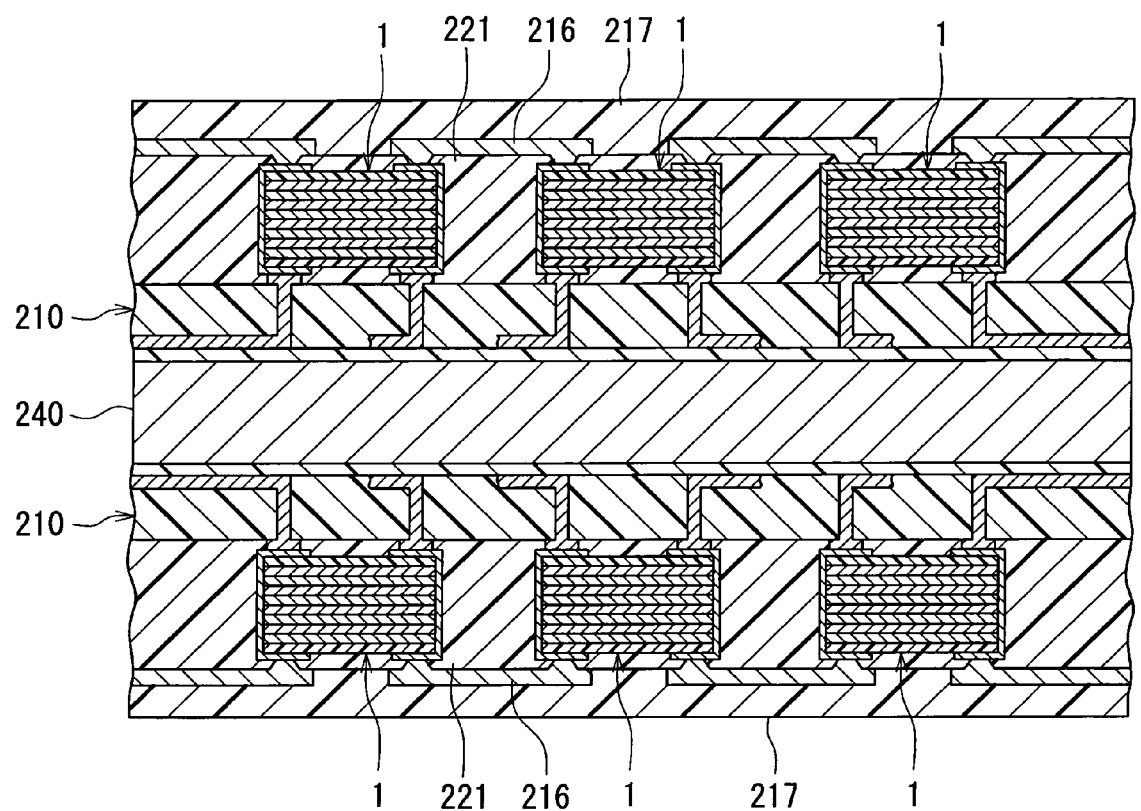
FIG. 40 is a cross-sectional view showing a fifth example of using a plurality of layered chip packages.

FIG. 40 shows a fifth example of using a plurality of layered chip packages 1. In this example, the module of the third example shown in FIG. 34 is joined to each of two surfaces of a cooling plate 240 made of a material having a high thermal conductivity, such as metal, to form a module. According to the fifth example, it is possible to provide the layered chip packages 1 with improved heat dissipation. Consequently, the fifth example makes it possible to provide a module including one or more layered chip packages 1 having a power semiconductor device (power device).

Figure 41:
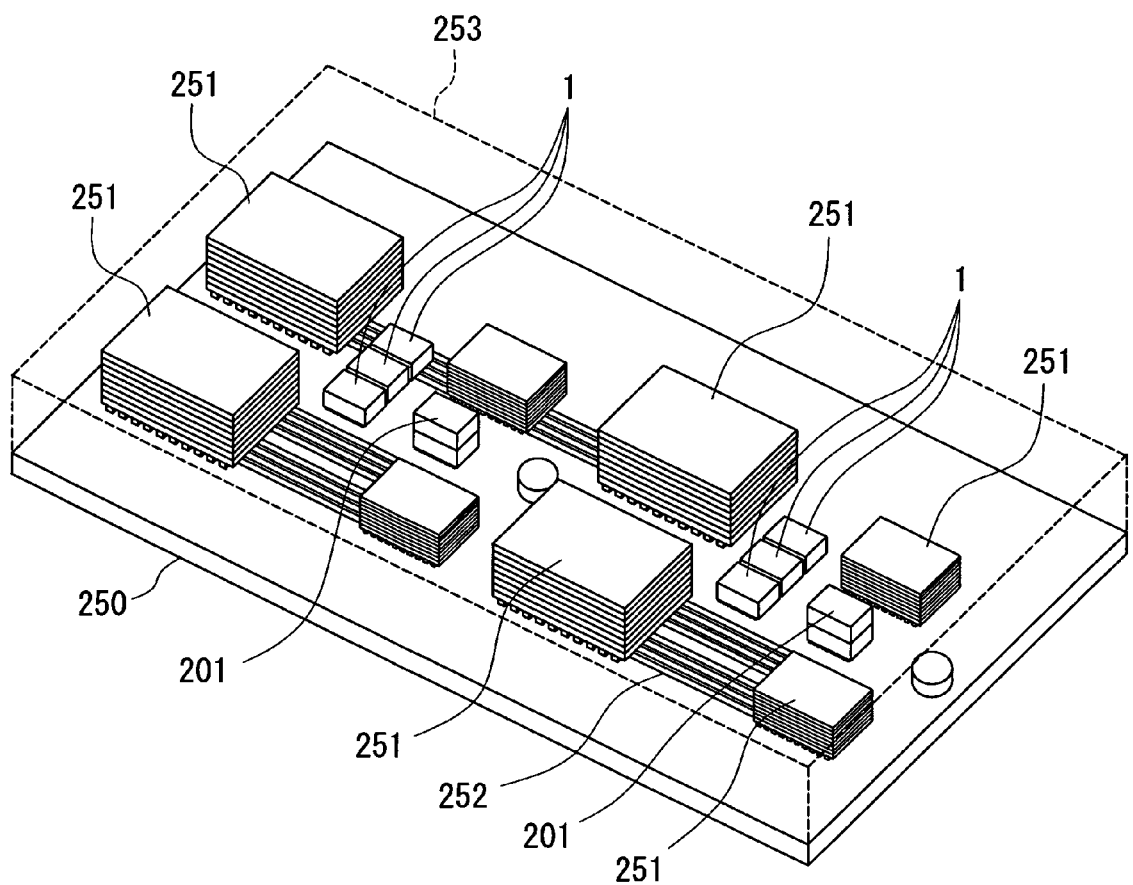
FIG. 41 is a perspective view showing a sixth example of using a plurality of layered chip packages.

FIG. 41 is a sixth example of using a plurality of layered chip packages 1. In this example, a plurality of layered chip packages 1 are mounted in various forms on a wiring board 250. FIG. 41 shows an example in which the following elements are mounted on the single wiring board 250: six layered chip packages 1 each provided singly; two electronic components 201 each of which includes two layered chip packages 1 as shown in FIG. 30; and eight modules 251 each of which includes a plurality of layered chip packages 1. The module 251 is any of the modules of the second to fifth examples. The wiring board 250 is provided with wiring 252 for establishing electrical connection between the elements mounted on the wiring board 250. The elements mounted on the wiring board 250 are sealed with a molded resin 253, for example.

As described so far, according to the present embodiment, it is possible to provide a layered chip package 1 that includes a plurality of chips 30 stacked and that is capable of achieving higher integration. The layered chip package 1 of the present embodiment includes: a main body 2 having a top surface, a bottom surface and four side surfaces; wiring 3 disposed on at least one of the side surfaces of the main body 2; a plurality of first terminals 22A disposed on the top surface 2a of the main body 2; and a plurality of second terminals 22B disposed on the bottom surface 2b of the main body 2. The main body 2 includes a plurality of layer portions 10 stacked. Each of the plurality of layer portions 10 includes: a semiconductor chip 30 having a top surface, a bottom surface and four side surfaces; an insulating portion 31 covering at least one of the four side surfaces of the semiconductor chip 30; and a plurality of electrodes 32 connected to the semiconductor chip 30. The insulating portion 31 has at least one end face 31a located at the at least one of the side surfaces of the main body 2 on which the wiring 3 is disposed. Each of the plurality of electrodes 32 has an end face 32a that is surrounded by the insulating portion 31 and located at the at least one of the side surfaces of the main body 2 on which the wiring 3 is disposed. The wiring 3 is connected to the end faces 32a of the plurality of electrodes 32 of the plurality of layer portions 10, and to the plurality of first and second terminals 22A and 22B.

According to the present embodiment, the plurality of semiconductor chips 30 stacked are electrically connected through the wiring 3 disposed on at least one of the side surfaces of the main body 2. Consequently, the present embodiment is free from the problems of the wire bonding method, that is, the problem that it is difficult to reduce the distance between electrodes so as to avoid contact between wires, and the problem that high resistances of the wires hamper a high-speed operation of a circuit.

Compared with the through electrode method, the present embodiment has the following advantages. First, the present embodiment does not require formation of through electrodes in each chip and consequently does not require a large number of steps for forming through electrodes in each chip.

According to the present embodiment, electrical connection between the plurality of semiconductor chips 30 is established through the wiring 3 disposed on at least one of the side surfaces of the main body 2. Consequently, the present embodiment provides higher reliability of electrical connection between chips as compared with the case of using through electrodes to establish electrical connection between chips.

Furthermore, according to the present embodiment, it is possible to easily change the line width and thickness of the wiring 3. Consequently, it is possible to respond to future demands for finer wiring 3.

The through electrode method requires that the through electrodes of upper and lower chips be connected to each other by means of, for example, soldering at high temperatures. In contrast, according to the present embodiment, it is possible to form the wiring 3 at lower temperatures because the wiring 3 can be formed by plating. According to the present embodiment, it is also possible to perform bonding of the plurality of layer portions 10 at low temperatures. Consequently, it is possible to prevent the chips 30 from suffering damage from heat.

The through electrode method further requires that upper and lower chips be accurately aligned for connecting the through electrodes of the upper and lower chips to each other. In contrast, according to the present embodiment, electrical connection between the semiconductor chips 30 is performed not at an interface between every vertically adjacent two of the layer portions 10 but through the use of the wiring 3 disposed on at least one of the side surfaces of the main body 2. Consequently, the accuracy required for alignment of the plurality of layer portions 10 is lower than that required for alignment of a plurality of chips in the through electrode method.

According to the through electrode method, the through electrodes of upper and lower chips are connected to each other by means of, for example, soldering. Consequently, if the plurality of chips stacked include one or more defective chips, it is difficult to replace the defective chip(s) with non-defective one(s). In contrast, according to the present embodiment, it is easy to replace one or more defective chips, if included in the layered chip package 1, with non-defective one(s). To replace a defective chip with a non-defective one, first, the wiring 3 is removed by means of, for example, polishing. Next, the main body 2 is disassembled to separate at least a layer portion 10 including a defective chip 30 from the other layer portions 10, and the defective chip 30 is taken out. According to the present embodiment, every vertically adjacent two of the layer portions 10 are bonded to each other with an adhesive, so that it is easy to separate them from each other. Next, the main body 2 is reconstructed with a non-defective chip 30 in place of the defective chip 30. Next, polishing is performed on the side surface(s) of the reconstructed main body 2 on which the wiring 3 is to be formed, and then the wiring 3 is formed on the polished side surface(s).

The manufacturing method for the layered chip package of the present embodiment allows a reduction in the number of steps and consequently allows a reduction in cost for the layered chip package, compared with the manufacturing method for a layered chip package disclosed in U.S. Pat. No. 5,953,588.

From the foregoing, the present embodiment makes it possible to mass-produce the layered chip package 1 at low cost in a short period of time.

According to the manufacturing method for the layered chip package of the present embodiment, it is possible to easily reduce the thicknesses of the plurality of substructures 110 to constitute the layered substructure 115 while preventing damage to the substructures 110. This allows a high-yield manufacture of the layered chip package 1 that achieves miniaturization and higher integration.

The layered chip package 1 of the present embodiment is provided with the wring 3 disposed on at least one of the side surfaces of the main body 2, the plurality of first terminals 22A disposed on the top surface 2a of the main body 2, and the plurality of second terminals 22B disposed on the bottom surface 2b of the main body 2. This allows an increase in variety of electrical connection between a plurality of layered chip packages 1, as shown in FIG. 30 to FIG. 41, for example. Consequently, the present embodiment allows miniaturization of a system including a plurality of layered chip packages 1.

Second Embodiment

A second embodiment of the present invention will now be described. The appearance of the layered chip package 1 of the second embodiment is as shown in FIG. 1 and FIG. 2, as in the case of the first embodiment.

Figure 42:
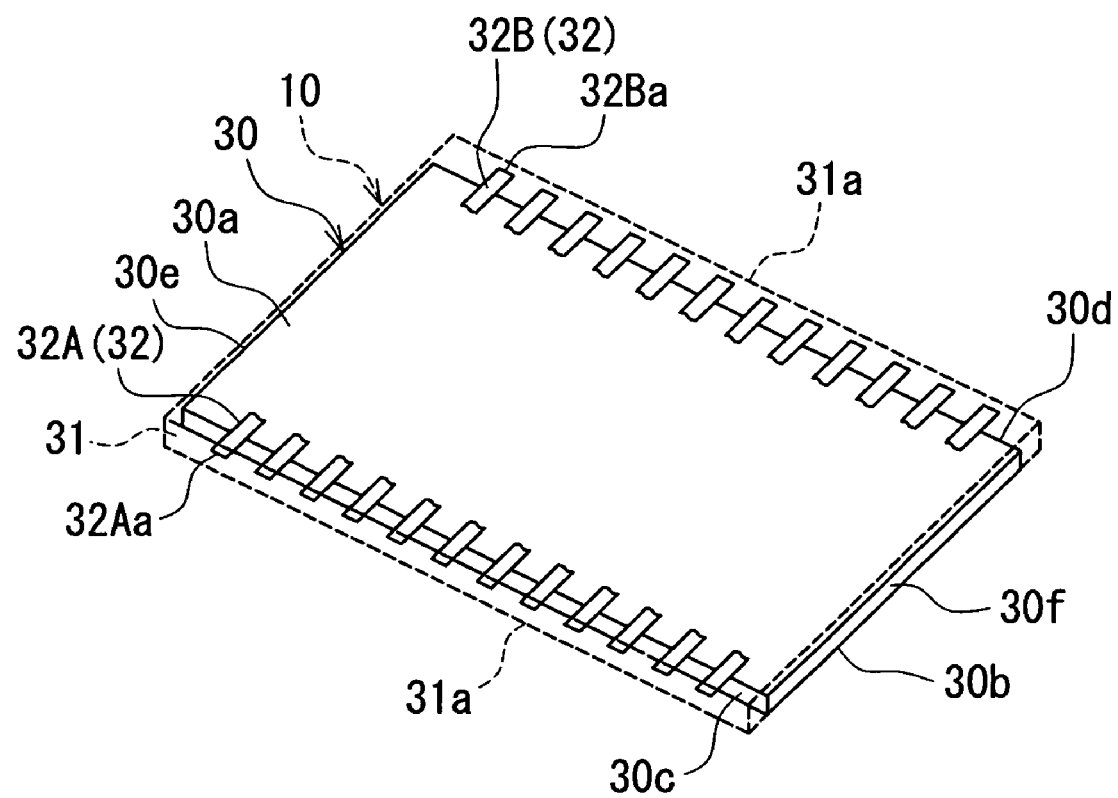
FIG. 42 is a perspective view of one of layer portions included in a layered chip package of a second embodiment of the invention.

FIG. 42 is a perspective view of a layer portion 10 of the second embodiment. According to the second embodiment, the third side surface 30e and the fourth side surface 30f of the semiconductor chip 30 are respectively located at the third side surface 2e and the fourth side surface 2f of the main body 2. The first side surface 30c and the second side surface 30d of the semiconductor chip 30 respectively face toward the first side surface 2c and the second side surface 2d of the main body. In the second embodiment, of the four side surfaces of the semiconductor chip 30, the first side surface 30c and the second side surface 30d are covered with the insulating portion 31 whereas the third side surface 30e and the fourth side surface 30f are not covered with the insulating portion 31.

Figure 43:
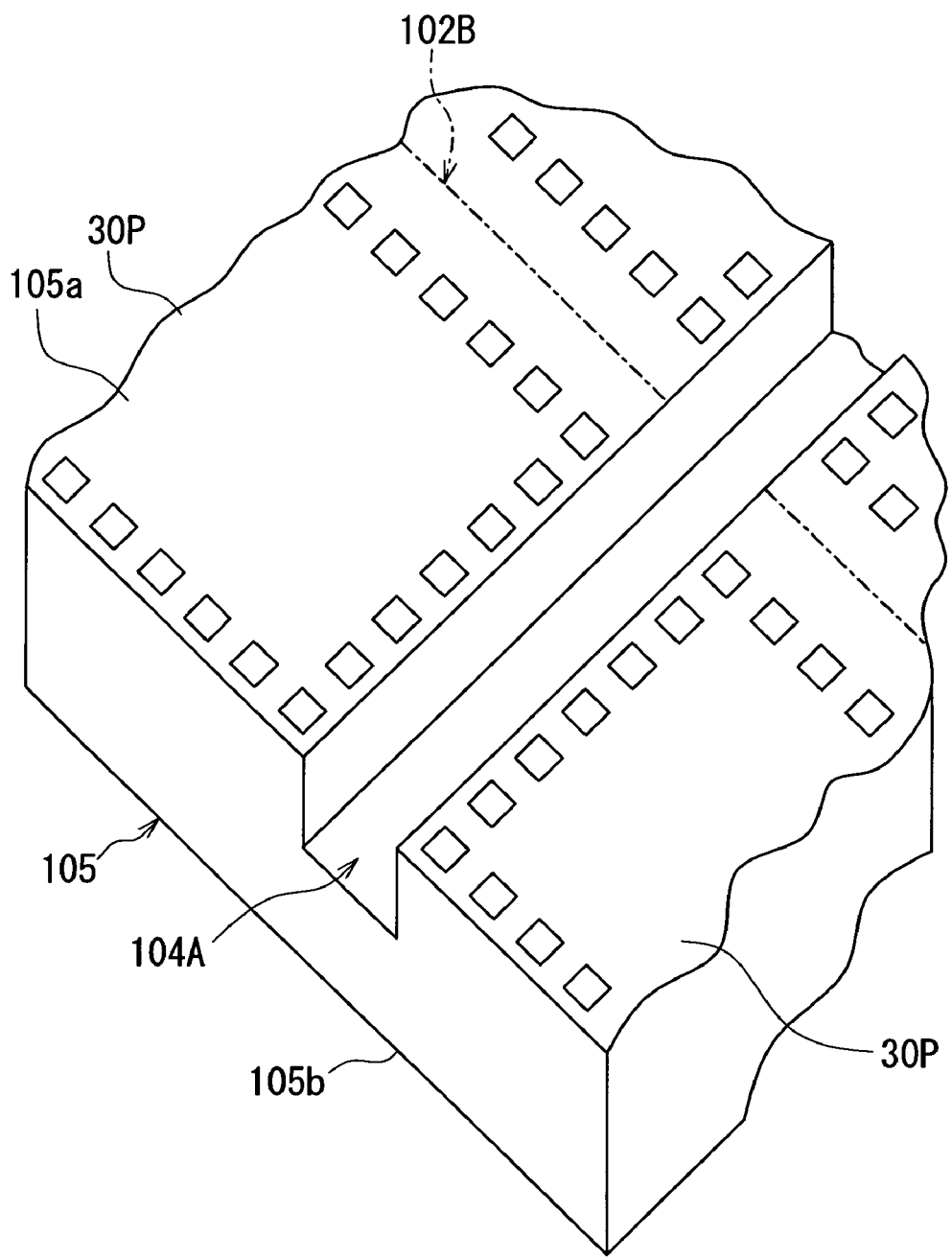
FIG. 43 is a perspective view of a portion of a pre-polishing substructure main body of the second embodiment of the invention.

Reference is now made to FIG. 43 to describe differences of the manufacturing method for the layered chip package 1 of the second embodiment from the method of the first embodiment. FIG. 43 shows a portion of the pre-polishing substructure main body 105 fabricated in the step of FIG. 5 according to the second embodiment. According to the second embodiment, in the step of FIG. 5, the plurality of first grooves 104A along the plurality of scribe lines 102A shown in FIG. 13 are only formed as the plurality of grooves 104. In other words, the plurality of second grooves 104B (see FIG. 15) along the plurality of scribe lines 102B are not formed in the second embodiment, although they are formed in the first embodiment. According to the second embodiment, in the step of FIG. 29 the main body aggregate 130 is cut along the scribe lines 102B and the pre-semiconductor-chip portions 30P are thereby separated from each other to become the semiconductor chips 30. By cutting the main body aggregate 130 along the scribe lines 102B, the third side surface 30e and the fourth side surface 30f of each semiconductor chip 30 are formed.

Compared with the first embodiment, the second embodiment allows an increase in proportion of the area occupied by the semiconductor chip 30 in each layer portion 10, and consequently allows the layered chip package 1 to achieve a higher level of integration. The remainder of configuration, function and effects of the second embodiment are similar to those of the first embodiment.

The present invention is not limited to the foregoing embodiments but can be carried out in various modifications. For example, while in the foregoing embodiments a plurality of main body aggregates 130 are arranged and then the wiring 3 is formed for the pre-main-body portions 2P of the plurality of main body aggregates 130 at the same time, the wiring 3 may be formed for the pre-main-body portions 2P of a single main body aggregate 130 without arranging a plurality of main body aggregates 130.

In addition, after the main body 2 is formed by cutting the main body aggregate 130 having undergone the formation of the wiring 3, another wiring may be formed on a surface formed for the main body 2 as a result of cutting the main body aggregate 130.

It is apparent that the present invention can be carried out in various forms and modifications in the light of the foregoing descriptions. Accordingly, within the scope of the following claims and equivalents thereof, the present invention can be carried out in forms other than the foregoing most preferred embodiments.

What is claimed is:

1. A layered chip package comprising:
   a main body having a top surface, a bottom surface and four side surfaces;
   wiring disposed on at least one of the side surfaces of the main body;
   a plurality of first terminals disposed on the top surface of the main body; and
   a plurality of second terminals disposed on the bottom surface of the main body, wherein:
   the main body includes a plurality of layer portions stacked between the top surface and the bottom surface;
   each of the plurality of layer portions includes: a semiconductor chip having a top surface, a bottom surface and four side surfaces; an insulating portion covering at least one of the four side surfaces of the semiconductor chip; and a plurality of electrodes connected to the semiconductor chip;
   the insulating portion has at least one end face located at the at least one of the side surfaces of the main body on which the wiring is disposed;
   each of the plurality of electrodes has an end face that is surrounded by the insulating portion and located at the at least one of the side surfaces of the main body on which the wiring is disposed; and
   the wiring is connected to the end faces of the plurality of electrodes of the plurality of layer portions, and to the plurality of first and second terminals.

2. A method of manufacturing a layered chip package, the layered chip package comprising:
   a main body having a top surface, a bottom surface and four side surfaces;
   wiring disposed on at least one of the side surfaces of the main body;
   a plurality of first terminals disposed on the top surface of the main body; and
   a plurality of second terminals disposed on the bottom surface of the main body, wherein:
   the main body includes a plurality of layer portions stacked;

each of the plurality of layer portions includes: a semiconductor chip having a top surface, a bottom surface and four side surfaces; an insulating portion covering at least one of the four side surfaces of the semiconductor chip; and a plurality of electrodes connected to the semiconductor chip;

the insulating portion has at least one end face located at the at least one of the side surfaces of the main body on which the wiring is disposed;

each of the plurality of electrodes has an end face that is surrounded by the insulating portion and located at the at least one of the side surfaces of the main body on which the wiring is disposed; and the wiring is connected to the end faces of the plurality of electrodes of the plurality of layer portions, and to the plurality of first and second terminals, the method comprising the steps of:

fabricating a plurality of substructures that respectively correspond to the plurality of layer portions of the layered chip package, each substructure including a plurality of its corresponding layer portions and being intended to be cut later at a boundary between every adjacent ones of the plurality of its corresponding layer portions; and completing the layered chip package by fabricating the main body using the plurality of substructures and by forming the first terminals, the second terminals and the wiring on the main body.

3. The method of manufacturing the layered chip package according to claim 2, wherein the step of fabricating the plurality of substructures includes, as a series of steps for fabricating each substructure, the step of fabricating a pre-substructure wafer by performing processing on a first surface of a semiconductor wafer having the first surface and a second surface that face toward opposite directions, the pre-substructure wafer having a first surface and a second surface that respectively correspond to the first surface and the second surface of the semiconductor wafer and including a plurality of pre-semiconductor-chip portions aligned, each of the pre-semiconductor-chip portions including a device;

the step of forming at least one groove in the pre-substructure wafer, the at least one groove opening at the first surface of the pre-substructure wafer and extending to be adjacent to at least one of the pre-semiconductor-chip portions;

the step of forming an insulating layer to fill the at least one groove, the insulating layer being intended to become part of the insulating portion later; and the step of forming the plurality of electrodes such that part of each of the electrodes lies on the insulating layer, wherein in the step of completing the layered chip package, the insulating layer is cut to form a cut surface along a direction in which the at least one groove extends, whereby part of the at least one end face of the insulating portion is formed by the cut surface of the insulating layer and the end faces of the plurality of electrodes are exposed.

4. The method of manufacturing the layered chip package according to claim 2, wherein the step of completing the layered chip package includes the steps of:

fabricating a layered substructure by stacking the plurality of substructures into a stack and providing a plurality of groups of first terminals and a plurality of groups of second terminals on the stack, wherein the plurality of substructures are stacked in correspondence with the order of stacking of the plurality of layer portions of the layered chip package;

forming a main body aggregate by cutting the layered substructure, the main body aggregate including a plurality of pre-main-body portions aligned in one direction that is orthogonal to a stacking direction of the plurality of layer portions, each of the pre-main-body portions being intended to later become the main body with the first terminals and the second terminals arranged thereon;

forming the wiring for each of the pre-main-body portions of the main body aggregate; and cutting the main body aggregate after the formation of the wiring so as to separate the plurality of pre-main-body portions from each other so that each of them becomes the main body and a plurality of layered chip packages are thereby formed.

5. The method of manufacturing the layered chip package according to claim 4, wherein, in the step of fabricating the layered substructure, a first terminal wafer including the plurality of groups of first terminals and a second terminal wafer including the plurality of groups of second terminals are respectively bonded to both end faces of the stack formed by stacking the plurality of substructures, the end faces being opposed to each other in a direction in which the substructures are stacked.

6. An electronic component comprising a plurality of layered chip packages and formed by electrically connecting every vertically adjacent two of the layered chip packages to each other, each of the plurality of layered chip packages comprising:

a main body having a top surface, a bottom surface and four side surfaces;

wiring disposed on at least one of the side surfaces of the main body;

a plurality of first terminals disposed on the top surface of the main body; and a plurality of second terminals disposed on the bottom surface of the main body, wherein:

the main body includes a plurality of layer portions stacked between the top surface and the bottom surface;

each of the plurality of layer portions includes: a semiconductor chip having a top surface, a bottom surface and four side surfaces; an insulating portion covering at least one of the four side surfaces of the semiconductor chip; and a plurality of electrodes connected to the semiconductor chip;

the insulating portion has at least one end face located at the at least one of the side surfaces of the main body on which the wiring is disposed;

each of the plurality of electrodes has an end face that is surrounded by the insulating portion and located at the at least one of the side surfaces of the main body on which the wiring is disposed;

the wiring is connected to the end faces of the plurality of electrodes of the plurality of layer portions, and to the plurality of first and second terminals; and in the vertically adjacent two of the layered chip packages, the first terminals of the lower one of the layered chip packages are electrically connected to the second terminals of the upper one of the layered chip packages.

* * * * *

UNITED STATES PATENT AND TRADEMARK OFFICE
CERTIFICATE OF CORRECTION

PATENT NO. : 7,745,259 B2  Page 1 of 1
APPLICATION NO. : 12/216168
DATED : June 29, 2010
INVENTOR(S) : Yoshitaka Sasaki et al.

It is certified that error appears in the above-identified patent and that said Letters Patent is hereby corrected as shown below:

The paragraph at column 7, line 46 to column 8, line 3 should be moved to between lines 57 and 58 of column 15.

The paragraph at column 8, lines 4-10 should be moved to between lines 58 and 59 of column 20.

Signed and Sealed this

Seventh Day of September, 2010

David J. Kappos
*Director of the United States Patent and Trademark Office*